US012713760B2

(12) United States Patent
Li

(10) Patent No.: US 12,713,760 B2
(45) Date of Patent: Aug. 18, 2026

(54) DISPLAY SUBSTRATE, MANUFACTURING METHOD THEREFOR, AND DISPLAY APPARATUS

(71) Applicants: Beijing BOE Technology Development Co., Ltd., Beijing (CN); BOE Technology Group Co., Ltd., Beijing (CN)

(72) Inventor: Dong Li, Beijing (CN)

(73) Assignees: Beijing BOE Technology Development Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 350 days.

(21) Appl. No.: 18/691,408

(22) PCT Filed: Aug. 24, 2022

(86) PCT No.: PCT/CN2022/114498
§ 371 (c)(1),
(2) Date: Mar. 12, 2024

(87) PCT Pub. No.: WO2024/040464
PCT Pub. Date: Feb. 29, 2024

(65) Prior Publication Data
US 2024/0389375 A1 Nov. 21, 2024

(51) Int. Cl.
*H10K 50/115* (2023.01)
*H10K 50/15* (2023.01)
(Continued)

(52) U.S. Cl.
CPC ........... *H10K 50/115* (2023.02); *H10K 50/15* (2023.02); *H10K 59/1201* (2023.02);
(Continued)

(58) Field of Classification Search
CPC .. H10K 50/115; H10K 50/15; H10K 59/1201; H10K 59/131; H10K 59/878;
(Continued)

(56) References Cited

U.S. PATENT DOCUMENTS 9,553,278 B2 * 1/2017 Kittichungchit ....... H10K 50/19
2017/0338289 A1 * 11/2017 Seo ........................ H10K 59/35
(Continued)

FOREIGN PATENT DOCUMENTS

CN 201927638 U 8/2011
CN 104701431 A 6/2015
(Continued)

*Primary Examiner* — Mohammed Shamsuzzaman
(74) *Attorney, Agent, or Firm* — IPro, PLLC

(57) ABSTRACT

Disclosed in the embodiments of the present disclosure are a display substrate, a manufacturing method therefor and a display device. The display substrate comprises a plurality of top-emitting quantum dot light-emitting devices, wherein each top-emitting quantum dot light-emitting device comprises: a first electrode and a second electrode arranged opposite to each other, a quantum dot light-emitting layer located between the first electrode and the second electrode, and an electron transport layer located between the first electrode and the quantum dot light-emitting layer; and a metal reflective layer is provided inside the electron transport layer.

15 Claims, 16 Drawing Sheets

(51) Int. Cl.
*H10K 59/12* (2023.01)
*H10K 59/131* (2023.01)
*H10K 59/80* (2023.01)
*H10K 102/00* (2023.01)

(52) U.S. Cl.
CPC ......... *H10K 59/131* (2023.02); *H10K 59/878* (2023.02); *H10K 2102/3026* (2023.02)

(58) Field of Classification Search
CPC ........... H10K 2102/3026; H10K 50/00; H10K 50/16; H10K 59/35; H10K 59/80518; H10K 59/00
See application file for complete search history.

(56) References Cited

U.S. PATENT DOCUMENTS

2018/0053903 A1* 2/2018 Suzuki ............... C07D 491/048
2021/0050543 A1* 2/2021 Kobashi ................. H10K 50/11

FOREIGN PATENT DOCUMENTS

CN 111162192 A 5/2020
CN 113871437 A * 12/2021 ............. H10K 71/00
CN 113948656 A 1/2022

* cited by examiner

--Prior art-- light extraction layer 9

Figure 15:
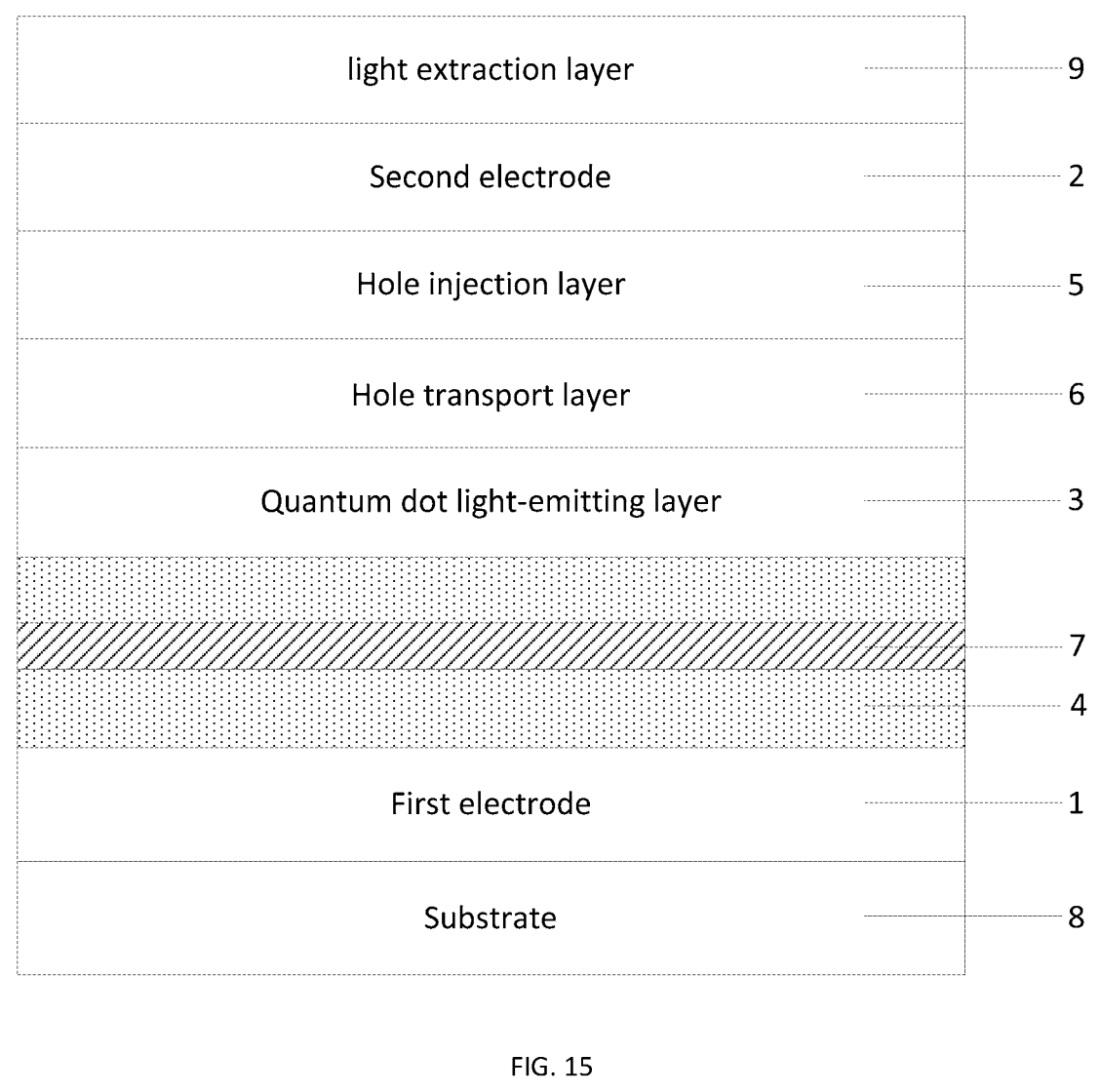

Second electrode 2

Hole injection layer 5

Hole transport layer 6

Quantum dot light-emitting layer 3

7

4

First electrode 1

Substrate 8

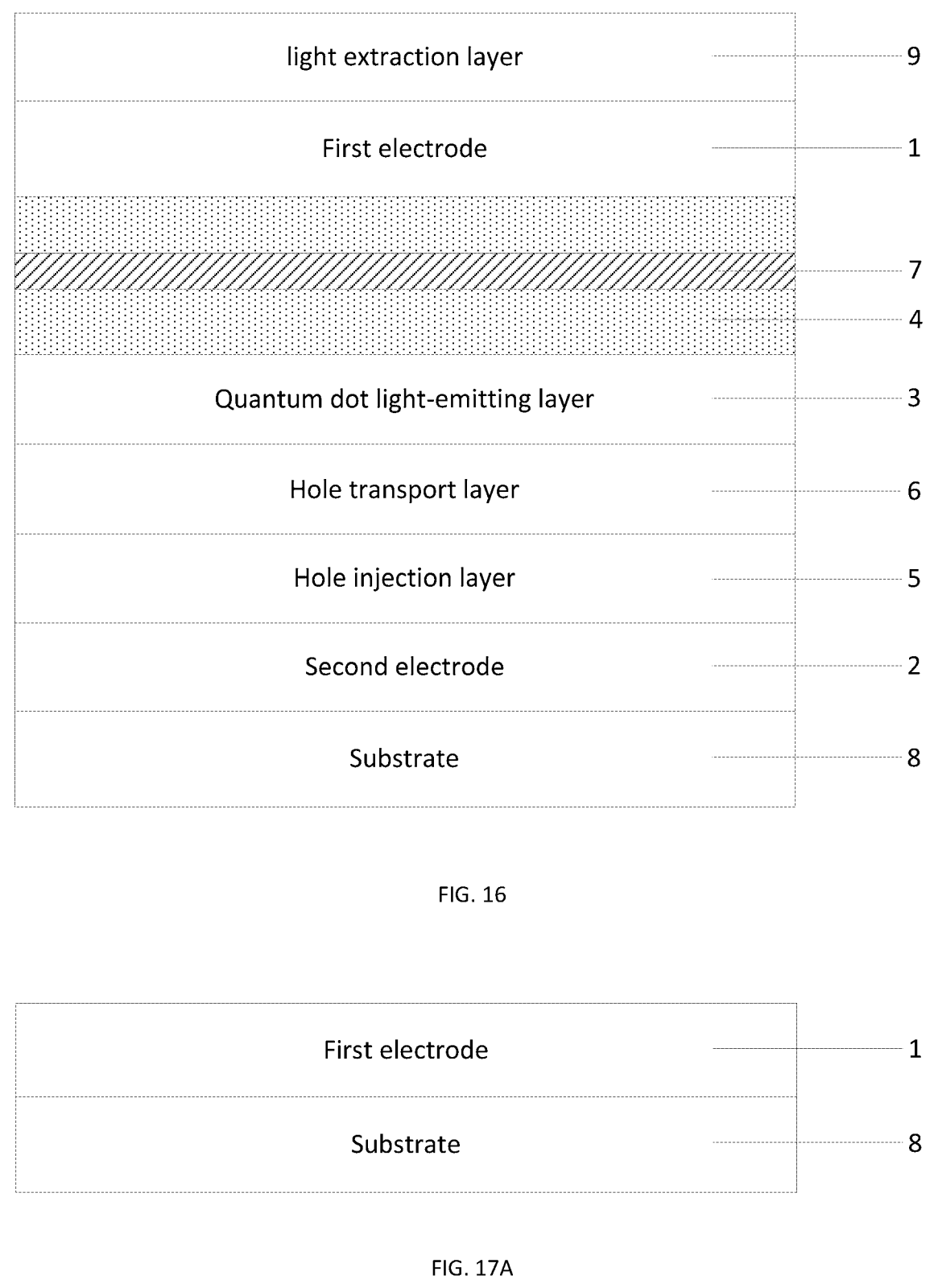

FIG. 15 light extraction layer 9
First electrode 1
7
4
Quantum dot light-emitting layer 3
Hole transport layer 6
Hole injection layer 5
Second electrode 2
Substrate 8

FIG. 16

First electrode 1
Substrate 8

FIG. 17A

DISPLAY SUBSTRATE, MANUFACTURING METHOD THEREFOR, AND DISPLAY APPARATUS

CROSS REFERENCE TO RELATED APPLICATIONS

The present disclosure is a national phase entry under 35 U.S.C. § 371 of International Application No. PCT/CN2022/114498, filed Aug. 24, 2022, the entire content of which is incorporated herein by reference.

TECHNICAL FIELD

The disclosure relates to the field of a display technology, in particular to a display substrate, manufacturing method therefor, and a display apparatus.

BACKGROUND

Quantum dots (QDs), as a new luminescent material, have become a research hotspot for luminescent materials in new type of light-emitting diodes due to their advantages such as high color purity, high luminescent quantum efficiency, adjustable luminescent color, and long service life. Therefore, Quantum Dot Light Emitting Diodes (QLED) with quantum dot materials as the luminescent layer has become the main direction of research for new display devices.

SUMMARY

Embodiments of the disclosure provide a display substrate, a method for manufacturing the display substrate, and a display apparatus.

The display substrate disclosed in embodiments of the disclosure includes multiple top-emission quantum dot light-emitting devices, and each of the multiple top-emission quantum dot light-emitting devices includes: a first electrode and a second electrode arranged opposite to each other; a quantum dot light-emitting layer between the first electrode and the second electrode; and an electron transport layer between the first electrode and the quantum dot light-emitting layer. A metal reflection layer is provided inside the electron transport layer.

Optionally, in the display substrate according to the embodiments of the disclosure, a ratio of an area of the metal reflection layer to an area of the electron transport layer in each of the multiple top-emission quantum dot light-emitting devices ranges from 50% to 100%.

Optionally, in the display substrate according to the embodiments of the disclosure, an included angle between a plane where the metal reflection layer is located and a plane where the electron transport layer is located is less than 1‰ degree.

Optionally, in the display substrate according to the embodiments of the disclosure, the multiple top-emission quantum dot light-emitting devices include multiple top-emission quantum dot light-emitting devices with different emission wavelengths; and a distance between the metal reflection layer and the first electrode in each of the multiple top-emission quantum dot light-emitting devices is inversely correlated with an emission wavelength of the each of the multiple top-emission quantum dot light-emitting devices.

Optionally, in the display substrate according to the embodiments of the disclosure, the multiple top-emission quantum dot light-emitting devices with different emission wavelengths include red top-emission quantum dot light-emitting devices, green top-emission quantum dot light-emitting devices, and blue top-emission quantum dot light-emitting devices. A distance between a metal reflection layer and a first electrode in the red top-emission quantum dot light-emitting devices is a first distance, a distance between a metal reflection layer and a first electrode in the green top-emission quantum dot light-emitting devices is a second distance, and a distance between a metal reflection layer and a first electrode in the blue top-emission quantum dot light-emitting devices is a third distance. The first distance ranges from 0 to 20 nm, the second distance ranges from 20 nm to 40 nm, and the third distance ranges from 40 nm to 60 nm.

Optionally, in the display substrate according to the embodiments of the disclosure, the metal reflection layer has a planar structure.

Optionally, in the display substrate according to the embodiments of the disclosure, an area of the metal reflection layer is smaller than an area of the electron transport layer, and the metal reflection layer is located in a central region of the electron transport layer.

Optionally, in the display substrate according to the embodiments of the disclosure, the metal reflection layer includes multiple hollow structures arranged separately.

Optionally, in the display substrate according to the embodiments of the disclosure, the multiple hollow structures are arranged in an array.

Optionally, the display substrate according to the embodiments of the disclosure further includes multiple data lines extending along a first direction and arranged along a second direction. The multiple hollow structures are strip-shaped hollow structures extending along the second direction and arranged along the first direction, and the first direction and the second direction intersect.

Optionally, in the display substrate according to the embodiments of the disclosure, a distance between adjacent hollow structures in each of the multiple top-emission quantum dot light-emitting devices is positively correlated with an emission wavelength of the each of the multiple top-emission quantum dot light-emitting devices.

Optionally, in the display substrate according to the embodiments of the disclosure, the metal reflection layer includes multiple reflective parts arranged separately and a hollow structure between adjacent reflective parts.

Optionally, in the display substrate according to the embodiments of the disclosure, the multiple reflective parts are arranged in an array.

Optionally, the display substrate according to the embodiments of the disclosure further includes multiple data lines extending along a first direction and arranged along a second direction. The multiple reflective parts are strip-shaped reflective parts extending along the second direction and arranged along the first direction, and the first direction and the second direction intersect.

Optionally, in the display substrate according to the embodiments of the disclosure, a distance between adjacent reflective parts in each of the multiple top-emission quantum dot light-emitting devices is positively correlated with an emission wavelength of the each of the multiple top-emission quantum dot light-emitting devices.

Optionally, in the display substrate according to the embodiments of the disclosure, a reflectance of the metal reflection layer in a visible light range ranges from 30% to 60%.

Optionally, in the display substrate according to the embodiments of the disclosure, a work function of the metal reflection layer ranges from 2.2 eV to 4.2 eV, and a thickness of the metal reflection layer ranges from 3 nm to 5 nm.

Optionally, in the display substrate according to the embodiments of the disclosure, a material of the metal reflection layer includes Mg, Ag, or Al.

Optionally, in the display substrate according to the embodiments of the disclosure, a material of the electron transport layer includes metal oxide nanoparticles, and a surface of the metal reflection layer away from the first electrode is uneven.

Optionally, in the display substrate according to the embodiments of the disclosure, a proportion of oxygen vacancies on a surface of the electron transport layer in contact with the first electrode is less than a proportion of oxygen vacancies on a surface of the electron transport layer in contact with the metal reflection layer.

Optionally, in the display substrate according to the embodiments of the disclosure, a thickness of the electron transport layer ranges from 50 nm to 80 nm.

Optionally, the display substrate according to the embodiments of the disclosure further includes a hole transport layer between the quantum dot light-emitting layer and the second electrode, and a hole injection layer between the hole transport layer and the second electrode.

Optionally, in the display substrate according to the embodiments of the disclosure, a thickness of the hole transport layer ranges from 10 nm to 40 nm, a thickness of the hole injection layer ranges from 3 nm to 7 nm, and a thickness of the quantum dot light-emitting layer ranges from 10 nm to 40 nm.

Correspondingly, Embodiments of the disclosure further provide a display apparatus, and the display apparatus includes the display substrate provided by any of the embodiments of the disclosure.

Embodiments of the disclosure further provide a method for manufacturing the display substrate provided by any of the embodiments of the disclosure. The method includes:

manufacturing the multiple top-emission quantum dot light-emitting devices. Where each of the multiple top-emission quantum dot light-emitting devices includes: the first electrode and the second electrode arranged opposite to each other; the quantum dot light-emitting layer between the first electrode and the second electrode; and the electron transport layer between the first electrode and the quantum dot light-emitting layer. Here, the metal reflection layer is provided inside the electron transport layer.

Optionally, in the method according to the embodiments of the disclosure, manufacturing the electron transport layer and the metal reflection layer includes: forming a first electron transport layer; forming the metal reflection layer on the first electron transport layer; and forming a second electron transport layer on the metal reflection layer. Here, the second electron transport layer and the first electron transport layer constitute the electron transport layer.

BRIEF DESCRIPTION OF FIGURES

FIG. 15 is a schematic diagram of a top-emission quantum dot light-emitting device with an inverted structure provided by embodiments of the disclosure.

FIG. 16 is a schematic diagram of a top-emission quantum dot light-emitting device with a conventional structure provided by embodiments of the disclosure.

FIGS. 17A-17H are schematic diagrams illustrating structures of the display substrate after each step of the manufacturing method of the display substrate.

DETAILED DESCRIPTION

Figure 1:
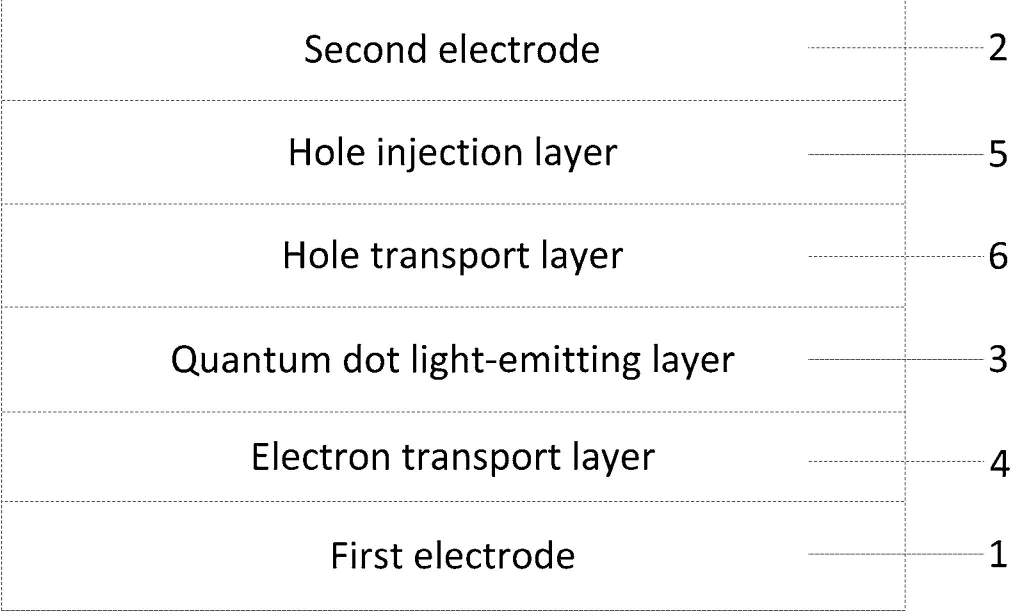
FIG. 1 is a schematic structural diagram of a top-emission quantum dot light-emitting device in related art.

In order to make objectives, technical solutions and advantages of the embodiments of the disclosure clearer, the technical solutions of the embodiments of the disclosure are described clearly and completely below with reference to the drawings of the embodiments of the disclosure. Apparently, the described embodiments are some, not all, of the embodiments of the disclosure. The embodiments in the disclosure and the features in the embodiments may be combined with each other without conflict. Based on the described embodiments of the disclosure, all other embodiments obtained by those of ordinary skill in the art without inventive efforts fall within the protection scope of the disclosure.

Unless otherwise indicated, the technical or scientific terms used in the disclosure shall have the usual meanings understood by a person of ordinary skill in the art to which the disclosure belongs. The words "first", "second" and the like used in the disclosure do not indicate any order, quantity or importance, but are only used to distinguish different components. The word "including" or "containing" and the like, means that an element or item preceding the word covers an element or item listed after the word and the equivalent thereof, without excluding other elements or items. The word "connection" or "coupling" and the like is not restricted to physical or mechanical connection, but may include electrical connection, whether direct or indirect. The terms "inside", "outside", "up", "down", etc., are used to indicate relative positional relationships, and when the absolute position of the described object changes, the relative positional relationship may change accordingly.

It should be noted that sizes and shapes of all figures in the drawings do not reflect a true scale and are only intended to illustrate the contents of the disclosure. Same or similar reference signs indicate same or similar elements or elements with the same or similar function throughout the disclosure.

Currently, Active Matrix Quantum Dot Light Emitting Display (AMQLED) products are receiving increasing attention due to their potential advantages in wide color gamut and long service life. The research on AMQLED is progressing, and the quantum efficiency is continuously improving, basically reaching the level of industrialization. Further industrialization using new processes and technologies is becoming a trend.

In the structure of QLED devices, due to reasons such as energy level positions and mobility, the injection of charge carriers in the device is unbalanced, requiring to adjust the injection of electrons and holes to be balanced to enhance device efficiency. Since electron injection is generally superior to hole injection, electrons dominate in the quantity of charge carriers. Therefore, apart from increasing hole injection, the usual approach is to suppress excess electron injection to achieve charge balance. In this case, there is a certain requirement for the thickness of the electron transport layer, which should not be too thin.

Currently, much of the QLED research focuses on bottom emission structures. However, the demand for high-resolution display products requires QLED devices to adopt a top emission structure, which can improve the aperture ratio. Simultaneously, optimization of the thickness of each film layer is needed to achieve the best electrical and optical structures for the device, as well as to optimize electrical balance and light-emitting efficiency, which is challenging. For the three primary color pixels (red, green, and blue), significant differences in the cavity lengths required for best light-emitting efficiency are evident. Typically, the red QLED device has the longest cavity length, around 140 nm, and the blue QLED device has the shortest, around 75 nm. For red QLED devices, the larger cavity length allows for greater adjustment space to optimize the electrical structure, and the film thickness of each layer can be larger, making it easier to achieve electrical balance. In contrast, for blue QLED devices, the appropriate cavity length results in smaller film thicknesses for each layer, reducing the space for adjusting electrical balance. Simultaneously, due to the shorter cavity length for blue QLED devices, the smaller film thickness for each layer may cause device leakage, further affecting electrical balance.

Figure 2:
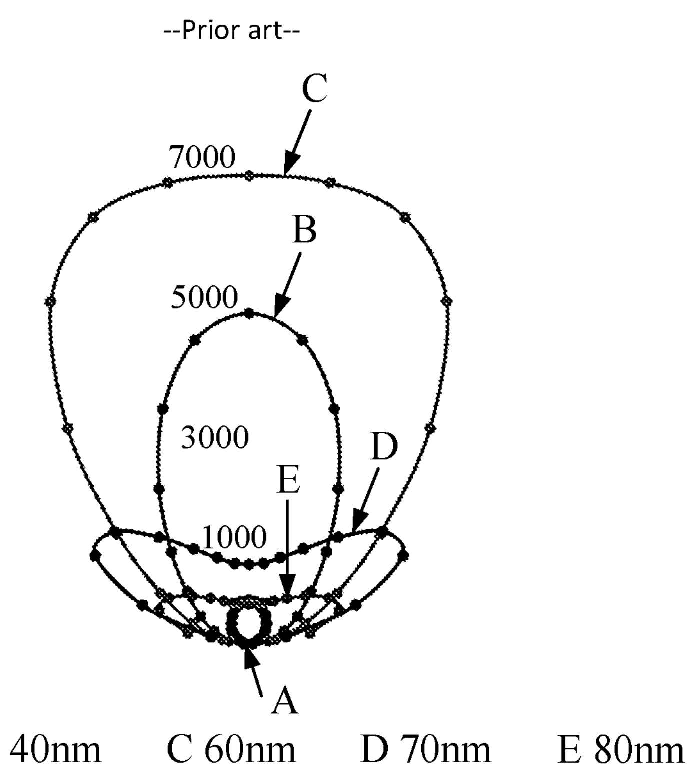
FIG. 2 is a schematic diagram showing a simulation of light-emitting angle distributions corresponding to the electron transport layer in a red quantum dot light-emitting device of FIG. 1 assuming different thicknesses.
Figure 3:
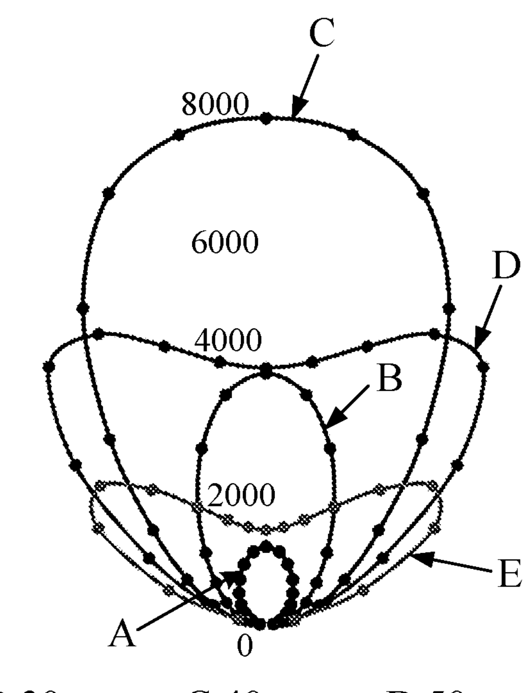
FIG. 3 is a schematic diagram showing a simulation of light-emitting angle distributions corresponding to the electron transport layer in a green quantum dot light-emitting device of FIG. 1 assuming different thicknesses.
Figure 4:
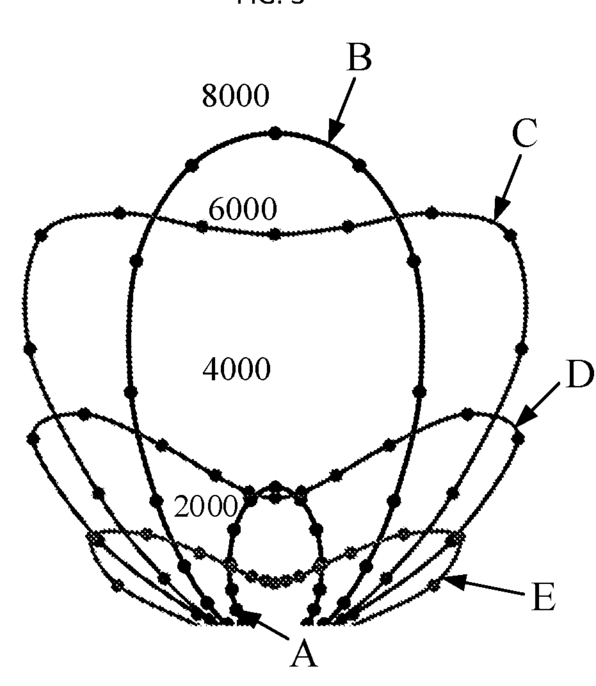
FIG. 4 is a schematic diagram showing a simulation of light-emitting angle distributions corresponding to the electron transport layer in a blue quantum dot light-emitting device of FIG. 1 assuming different thicknesses.
Figure 5:
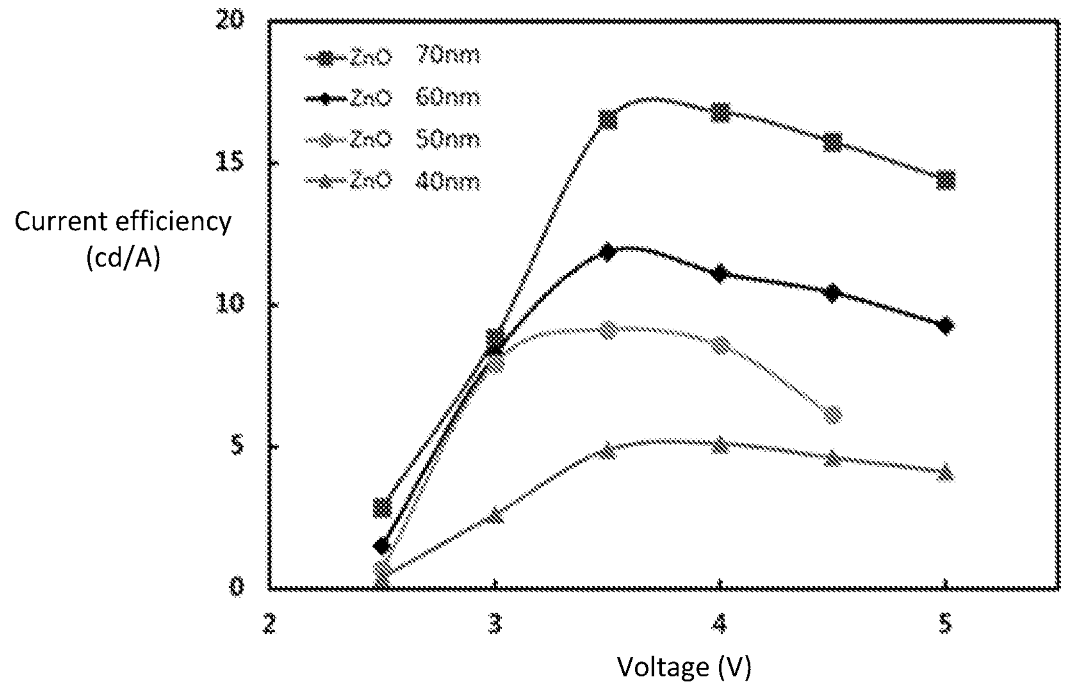
FIG. 5 is a schematic diagram showing current efficiency-voltage curves corresponding to the electron transport layer in a green quantum dot light-emitting device of FIG. 1 assuming different thicknesses.

As shown in FIG. 1, FIG. 1 is a schematic structural diagram of a top-emission QLED device in the related art, including: a first electrode 1 and a second electrode 2 oppositely arranged, a quantum dot light-emitting layer 3 between the first electrode 1 and the second electrode 2, an electron transport layer 4 between the first electrode 1 and the quantum dot light-emitting layer 3, a hole injection layer 5 between the second electrode 2 and the quantum dot light-emitting layer 3, and a hole transport layer 6 between the quantum dot light-emitting layer 3 and the hole injection layer 5. Through research, inventors of the application found that when the thickness of the quantum dot light-emitting layer 3 is 30 nm, the thickness of the hole transport layer 6 is 40 nm, and the thickness of the hole injection layer 5 is 7 nm, the QLED device has better electrical balance. The following simulation is based on the thickness of the quantum dot light-emitting layer 3 being 30 nm, the thickness of the hole transport layer 6 being 40 nm, and the thickness of the hole injection layer 5 being 7 nm. The impact of different thicknesses of the electron transport layer 4 on the light-emitting efficiency of red, green, and blue QLED devices is simulated, as shown in FIGS. 2-4. FIG. 2 is a schematic diagram of the simulated light-emitting angle distribution of a red QLED device corresponding to FIG. 1 when the thickness of the electron transport layer 4 is different (20 nm, 40 nm, 60 nm, 70 nm, 80 nm), and the corresponding cavity lengths for different thicknesses of the electron transport layer 4 are approximately 100 nm, 120 nm, 140 nm, 150 nm, 160 nm, respectively. As can be seen from FIG. 2, the optimal light-emitting efficiency corresponds to the case that the thickness of the electron transport layer 4 is 60 nm (corresponding to a cavity length of 140 nm). FIG. 3 is a schematic diagram of the simulated light-emitting angle distribution of a green QLED device corresponding to FIG. 1 when the thickness of the electron transport layer 4 is different (20 nm, 30 nm, 40 nm, 50 nm, 60 nm), and the corresponding cavity lengths for different thicknesses of the electron transport layer 4 are approximately 100 nm, 110 nm, 120 nm, 130 nm, 140 nm, respectively. From FIG. 3, it can be seen that the optimal light-emitting efficiency corresponds to the case that the thickness of the electron transport layer 4 is 40 nm (corresponding to a cavity length of 120 nm). FIG. 4 is a schematic diagram of the simulated light-emitting angle distribution of a blue QLED device corresponding to FIG. 1 when the thickness of the electron transport layer 4 is different (10 nm, 20 nm, 30 nm, 40 nm, 50 nm), and the corresponding cavity lengths for different thicknesses of the electron transport layer 4 are approximately 90 nm, 100 nm, 110 nm, 120 nm, 130 nm, respectively. From FIG. 4, it can be seen that the optimal light-emitting efficiency corresponds to the case that the thickness of the electron transport layer 4 is 20 nm (corresponding to a cavity length of 100 nm). Therefore, the thickness of the electron transport layer 4 of red, green, and blue QLED devices with the optimal light-emitting efficiency is 60 nm, 40 nm, and 20 nm, respectively. However, when the light-emitting efficiency of the device is optimal, the current efficiency of the device is not necessarily optimal. Taking the green QLED device as an example, as shown in FIG. 5, FIG. 5 is a schematic diagram of the current efficiency-voltage curves for the QLED device corresponding to FIG. 1 when the thickness of the electron transport layer 4 (ZnO) is different (40 nm, 50 nm, 60 nm, 70 nm), and the corresponding cavity lengths for different thicknesses of the electron transport layer 4 are approximately 120 nm, 130 nm, 140 nm, 150 nm, respectively. The light-emitting efficiency is optimal when the thickness of the electron transport layer 4 is 40 nm according to FIG. 3, the current efficiency of the device is worst when the thickness of the electron transport layer 4 is 40 nm according to FIG. 5. That is, when the optical performance of the device is optimal, the electrical performance of the device is worst. The main reason is that when the thickness of the electron transport layer 4 is 40 nm, the thickness is relatively low, and excessive electron injection occurs, resulting in poor electrical balance of the device, thereby affecting the overall performance of the device. In addition, when the thickness of the electron transport layer 4 for the blue QLED device is 20 nm, the light-emitting efficiency is optimal. However, at this time, the thickness of the electron transport layer 4 is relatively thin, resulting in significant device leakage, further increasing the impact on electrical balance. Therefore, how to find a suitable device structure, balancing the best electrical and optical structures of the device, is a technical problem that urgently needs to be solved by those skilled in the art.

Figure 6:
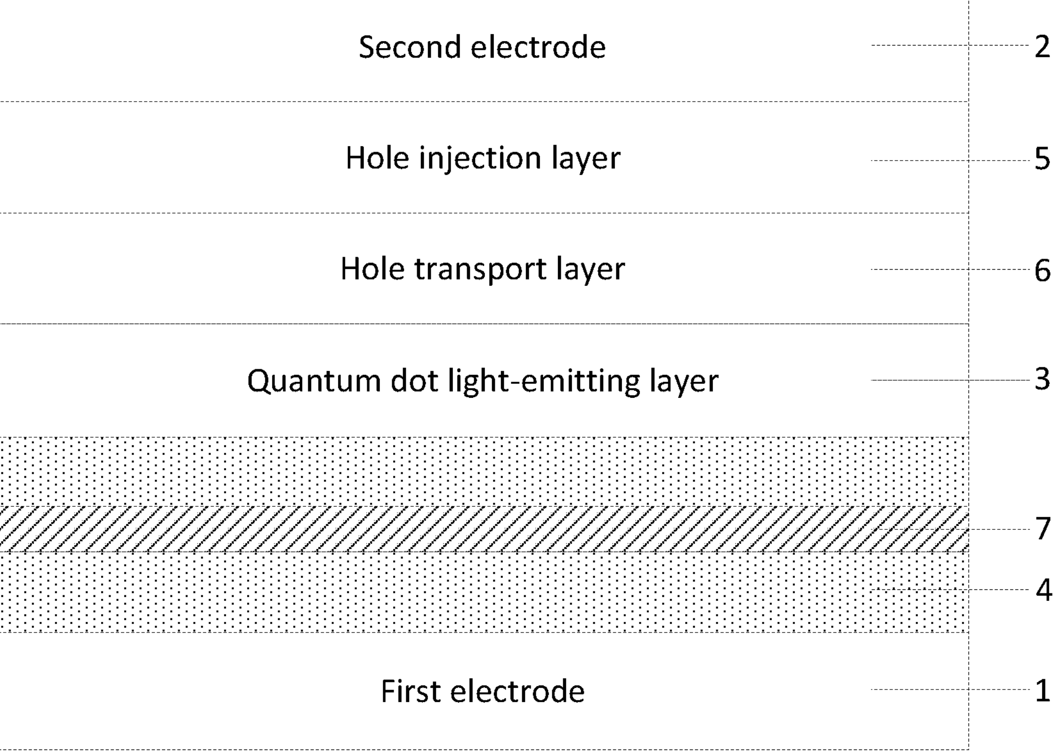
FIG. 6 is a schematic structural diagram of a top-emission quantum dot light-emitting device provided by embodiments of the disclosure.

In view of this, embodiments of the disclosure provide a display substrate including multiple top-emission quantum dot light-emitting devices, as shown in FIG. 6. FIG. 6 just schematically shows the structure of one top-emission quantum dot light-emitting device. Each top-emission quantum dot light-emitting device includes first electrode 1 and the second electrode 2 opposite to each other, a quantum dot light-emitting layer 3 between the first electrode 1 and the second electrode 2, and an electron transport layer 4 between the first electrode 1 and the quantum dot light-emitting layer 3. Here, there is a metal reflection layer 7 inside the electron transport layer 4.

The above display substrate provided in the embodiments provides a metal reflection layer inside the electron transport layer, and the microcavity length of the device can be adjusted. For example, while ensuring the electrical balance of the device, a microcavity length (not conductive to light extraction) corresponding to a larger current efficiency (thicker electron transport layer) can be adjusted to a more suitable microcavity length (reducing the microcavity length is conducive to light extraction). By adjusting the light emission of the device through the microcavity between the metal reflection layer and the second electrode, a thickness of the electron transport layer between the metal reflection layer and the quantum dot light-emitting layer can be reduced, thereby achieving optimal light-emitting efficiency. In this case, there is still an electron transport layer between the metal reflection layer and the first electrode, and this part of the electron transport layer can be used to adjust the electrical balance of the device, so that the thickness of the electron transport layer in the device does not become too low, and the electrical balance of the device can be achieved. Therefore, according to the embodiments of the disclosure, optimal light-emitting efficiency and optimal current efficiency of the device can be achieved simultaneously.

In specific implementations, to ensure that the metal reflection layer can play the role of adjusting the microcavity length of the device, in the display substrate provided in the embodiments of the disclosure, in each top-emission quantum dot light-emitting device, a ratio of an area of the metal reflection layer to an area of the electron transport layer can be 50% to 100%. For example, the ratio of the area of the metal reflection layer to the area of the electron transport layer may be 50%, 60%, 70%, 80%, 90%, 100%, etc.

In specific implementations, to improve the light emitting effect of the device, a plane where the metal reflection layer is located and a plane where the electron transport layer is located are generally designed to be parallel. However, due to errors in the manufacturing process, such as the non-uniformity of film thickness distribution, the plane where the metal reflection layer is located and the plane where the electron transport layer is located may not be completely parallel. In the display substrate provided in the embodiments of the disclosure, an included angle between the plane where the metal reflection layer is located and the plane where the electron transport layer is located is less than 1‰ degree.

Figures 7A, 7B:
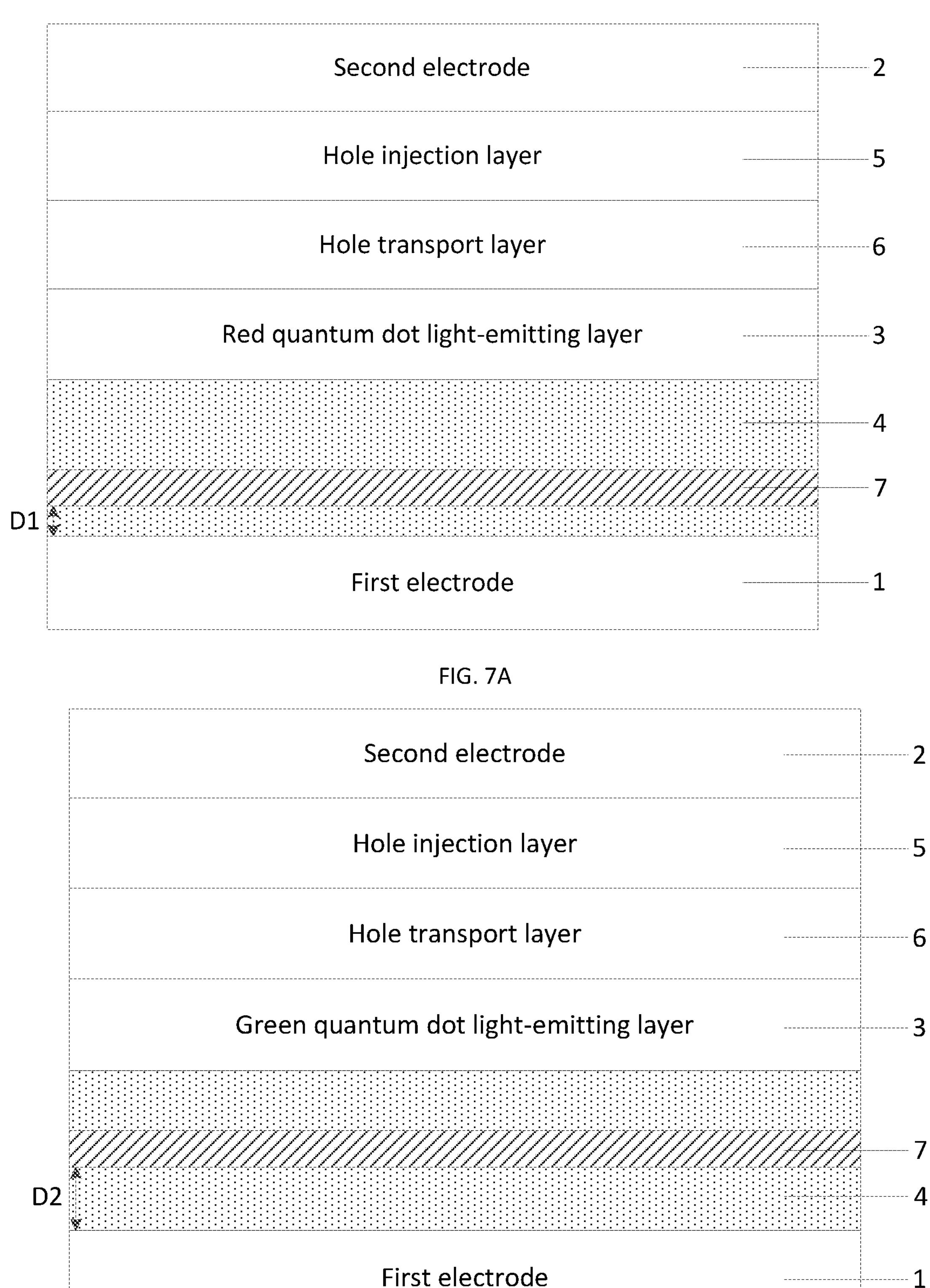
FIG. 7A is a schematic structural diagram of a red top-emission quantum dot light-emitting device provided by embodiments of the disclosure.
FIG. 7B is a schematic structural diagram of a green top-emission quantum dot light-emitting device provided by embodiments of the disclosure.
Figure 7C:
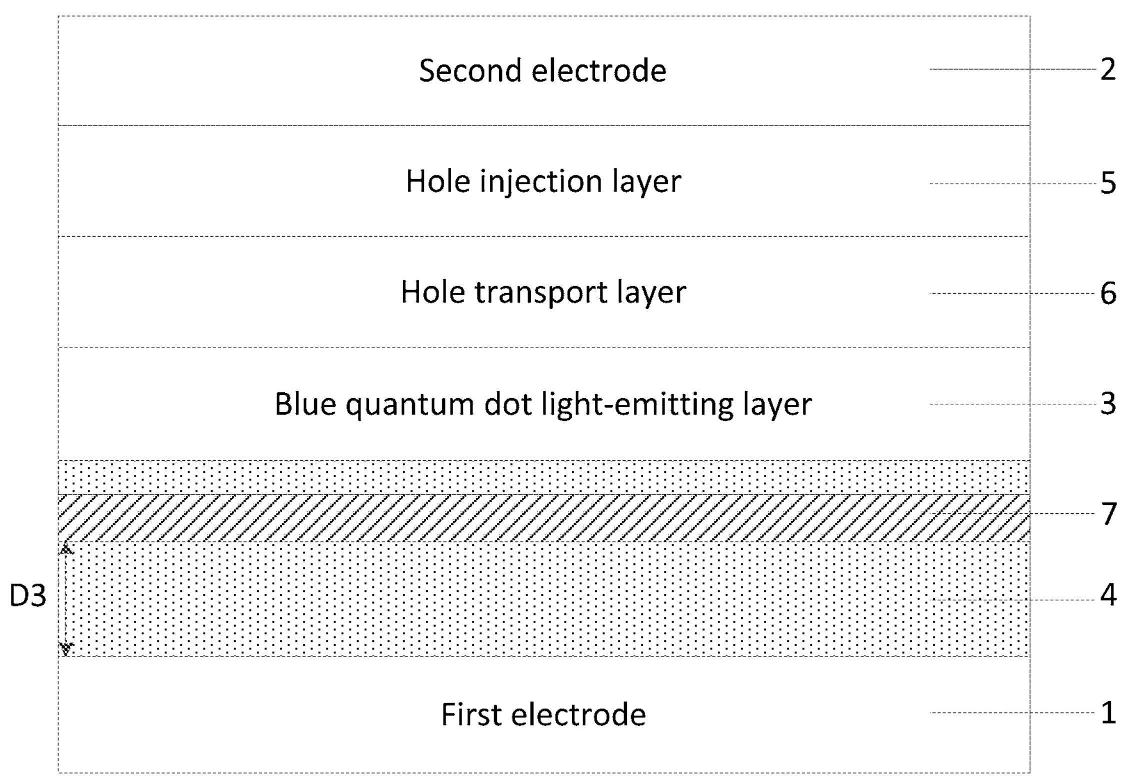
FIG. 7C is a schematic structural diagram of a blue top-emission quantum dot light-emitting device provided by embodiments of the disclosure.

In specific implementations, as shown in FIGS. 7A-7C, in the display substrate provided in the embodiments of the disclosure, the multiple top-emission quantum dot light-emitting devices include top-emission quantum dot light-emitting devices with different emission wavelengths (e.g., FIG. 7A corresponds to one emission wavelength, FIG. 7B corresponds to another emission wavelength, FIG. 7C corresponds to yet another emission wavelength). Since the shorter the emission wavelength, the smaller the optimal microcavity length (a distance between the metal reflection layer 7 and the second electrode 2) for the device, a distance between the metal reflection layer 7 and the first electrode 1 in each top-emission quantum dot light-emitting device may be inversely correlated with the emission wavelength of the top-emission quantum dot light-emitting device. For example, the top-emission quantum dot light-emitting device shown in FIG. 7A correspond to the largest emission wavelength, the top-emission quantum dot light-emitting device shown in FIG. 7B corresponds to the second-largest emission wavelength, and the top-emission quantum dot light-emitting device shown in FIG. 7C corresponds to the smallest emission wavelength. A distance between the metal reflection layer 7 and the first electrode 1 in the top-emission quantum dot light-emitting device shown in FIG. 7A is the smallest, a distance between the metal reflection layer 7 and the first electrode 1 in the top-emission quantum dot light-emitting device shown in FIG. 7B is the second smallest, and a distance between the metal reflection layer 7 and the first electrode 1 in the top-emission quantum dot light-emitting device shown in FIG. 7C is the largest. As such, the optimal light-emitting efficiencies of the devices with different emission wavelength can be ensured.

In specific implementations, in the display substrate provided by embodiments of the disclosure, as shown in FIGS. 7A-7C, the top-emission quantum dot light-emitting devices with different emission wavelengths may include red top-emission quantum dot light-emitting devices (as shown in FIG. 7A), green top-emission quantum dot light-emitting devices (as shown in FIG. 7B), and blue top-emission quantum dot light-emitting devices (as shown in FIG. 7C). A distance between the metal reflection layer 7 and the first electrode 1 in the red top-emission quantum dot light-emitting device may be a first distance D1, a distance between the metal reflection layer 7 and the first electrode 1 in the green top-emission quantum dot light-emitting device may be a second distance D2, and a distance between the metal reflection layer 7 and the first electrode 1 in the blue top-emission quantum dot light-emitting device may be a third distance D3. The first distance D1 is smaller than the second distance D2, and the second distance D2 is smaller than the third distance D3. By setting the position of the metal reflection layer 7 inside the electron transport layer 4 for devices with different emission colors, the microcavity lengths corresponding to the devices with different emission colors can be the microcavity lengths corresponding to the optimal light-emitting efficiencies. Since the microcavity length can be adjusted by adjusting the position of the metal reflection layer 7 inside the electron transport layer 4, the thickness of the electron transport layer 4 can be set to a thickness range corresponding to a better current efficiency, so that the device does not have a leakage problem.

In specific implementations, in the display substrate provided by embodiments of the disclosure, as shown in FIG. 7A, the first distance D1 can range from 0 to 20 nm, and the distance between the metal reflection layer 7 and the quantum dot light-emitting layer 3 is around 60 nm. As shown in FIG. 7B, the second distance D2 can range from 20 nm to 40 nm, and the distance between the metal reflection layer 7 and the quantum dot light-emitting layer 3 is around 40 nm. As shown in FIG. 7C, the third distance D3 can range from 40 nm to 60 nm, and the distance between the metal reflection layer 7 and the quantum dot light-emitting layer 3 is around 20 nm. The ranges of the first distance D1, the second distance D2, and the third distance D3 are set to ensure better electrical and optical performance of the device.

In specific implementations, in the display substrate provided by the embodiments of the disclosure, a reflectance of the metal reflection layer within the visible light range can be in the range of 30% to 60%, providing a certain level of transmittance and reflectance to adjust the microcavity length of the device.

In specific implementations, a work function of the metal reflection layer in the display substrate provided by embodiments of the disclosure can range from 2.2 eV to 4.2 eV, and a thickness of the metal reflection layer can range from 3 nm to 5 nm. The metal reflection layer within this thickness range does not adversely affect the electrical performance of the device.

In specific implementations, a material of the metal reflection layer in the display substrate provided by embodiments of the disclosure can include, but is not limited to, metals such as Mg, Ag, Al, etc.

Figure 8:
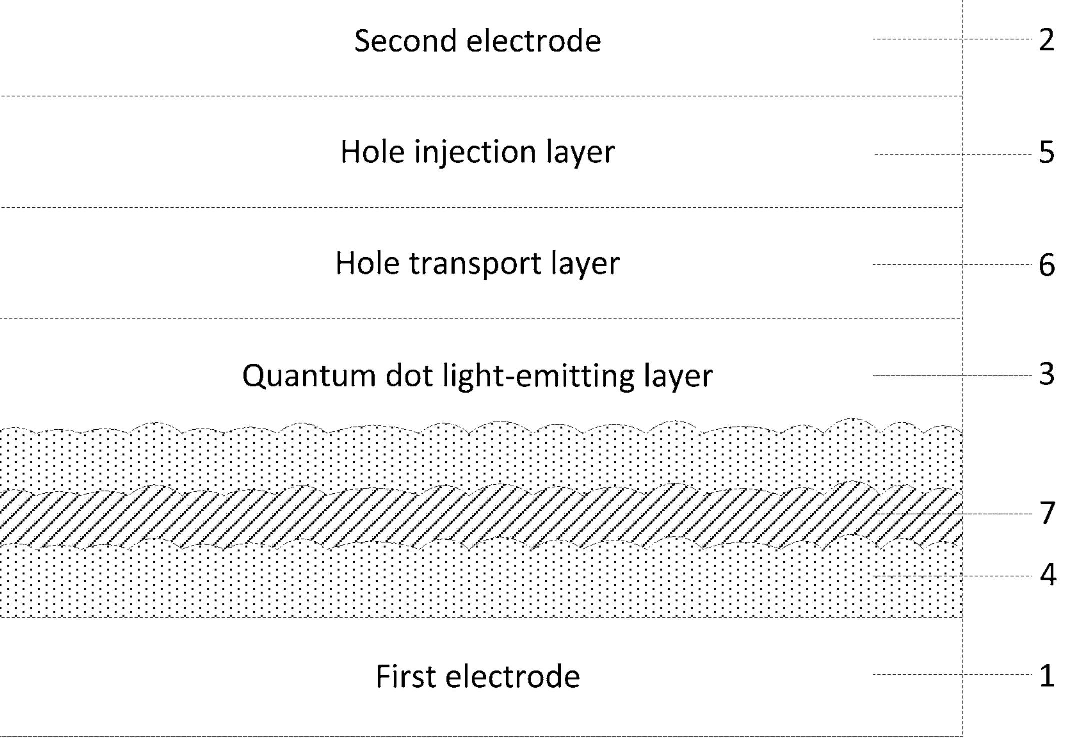
FIG. 8 is another schematic structural diagram of a top-emission quantum dot light-emitting device provided by embodiments of the disclosure.

In specific implementations, the material of the electron transport layer in the display substrate provided by embodiments of the disclosure can include metal oxide nanoparticles, such as ZnO or ZnMgO, etc. The electron transport layer 4 is generally prepared by sputtering or evaporation. To simplify the manufacturing process, the metal reflection layer 7 can be prepared using the same process as the electron transport layer 4, for example, both can be sputtered. During the sputtering of the electron transport layer, an additional step of sputtering metal can be added without the need for additional equipment, thus avoiding an increase in process complexity. As shown in FIG. 8, since the material of the electron transport layer 4 is metal oxide nanoparticles, a surface, facing away the first electrode 1, of the electron transport layer 4 in contact with the first electrode 1 is uneven. Therefore, a surface of the metal reflection layer 7 away from the surface of the first electrode 1 is uneven, and the uneven surface of the metal reflection layer 7 can refract and reflect emitted light, to enhance light-emitting efficiency.

It should be noted that FIG. 8 is just illustrative to show the uneven structure of the surfaces of the electron transport layer 4 and the metal reflection layer 7 and does not represent the actual structure of the uneven surface.

In specific implementations, in the display substrate provided by the embodiments of the disclosure, as shown in FIG. 6, metal atoms (indicated as M) on a surface of the metal reflection layer 7 in contact with the electron transport layer 4 may form a chemical bond with oxygen atoms O in the electron transport layer 4, such as forming an M—O bond. The M—O bonds formed on the surface do not turn the entire metal reflection layer 7 into an oxide, and the metal reflection layer 7 includes the metal component inside the metal reflection layer 7, maintaining its reflective properties. Moreover, the formed M—O bond can increase the proportion of oxygen vacancies in the electron transport layer 4, that is, an oxygen vacancy ratio on the surface of the electron transport layer 4 in contact with the first electrode 1 is smaller than an oxygen vacancy ratio on the surface of the electron transport layer 4 in contact with the metal reflection layer 7. This can reduce the electron conductivity of the electron transport layer 4, thereby lowering the electron injection efficiency in the device and improving the injection balance of carrier.

Figure 9:
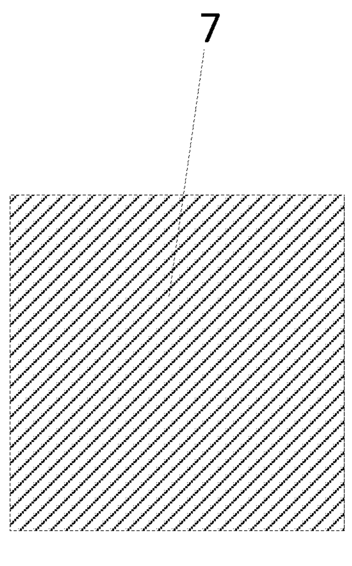
FIG. 9 is planar schematic diagram of a metal reflection layer in FIG. 6.

In specific implementations, as shown in FIG. 9 which is a planar schematic diagram of the metal reflection layer 7 shown in FIG. 6. The metal reflection layer 7 has a planar structure. Specifically, an area of the metal reflection layer 7 can be equal to an area of the electron transport layer 4.

Figure 10:
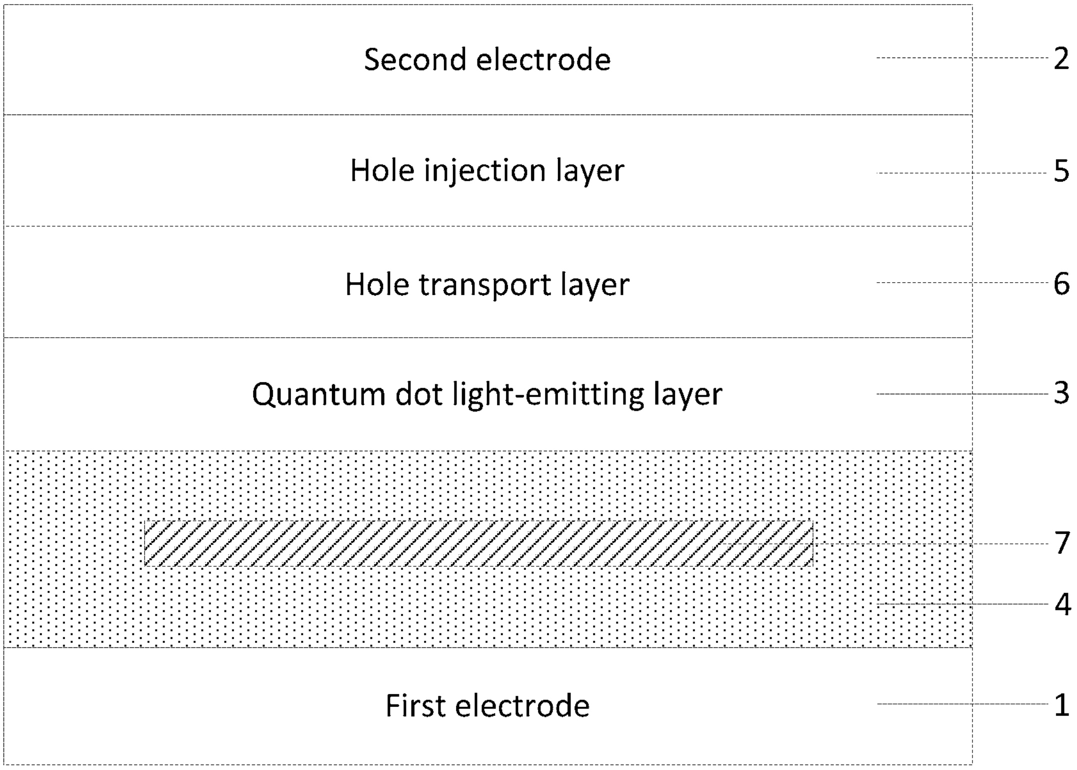
FIG. 10 is another schematic structural diagram of a top-emission quantum dot light-emitting device provided by embodiments of the disclosure.

In specific implementations, in the display substrate provided by the embodiments of the disclosure, as shown in FIG. 10 which is another cross-sectional schematic diagram of the top-emission quantum dot light-emitting device, the metal reflection layer 7 has a planar structure, and the area of the metal reflection layer 7 can be smaller than the area of the electron transport layer 4. The metal reflection layer 7 is located in a central region of the electron transport layer 4. This ensures that the electron transport layer 4 at the edge is an integrated structure, guaranteeing the continuity of the electron transport layer 4 and improving electrical performance. Additionally, the metal reflection layer 7 shortens the cavity length, focusing the emitted light on the front and reducing side emissions.

Specifically, regarding the structure of the metal reflection layer 7 shown in FIG. 10, for devices with different emission wavelengths, the design position of the metal reflection layer 7 can follow the position design method shown in FIG. 6.

Figure 11:
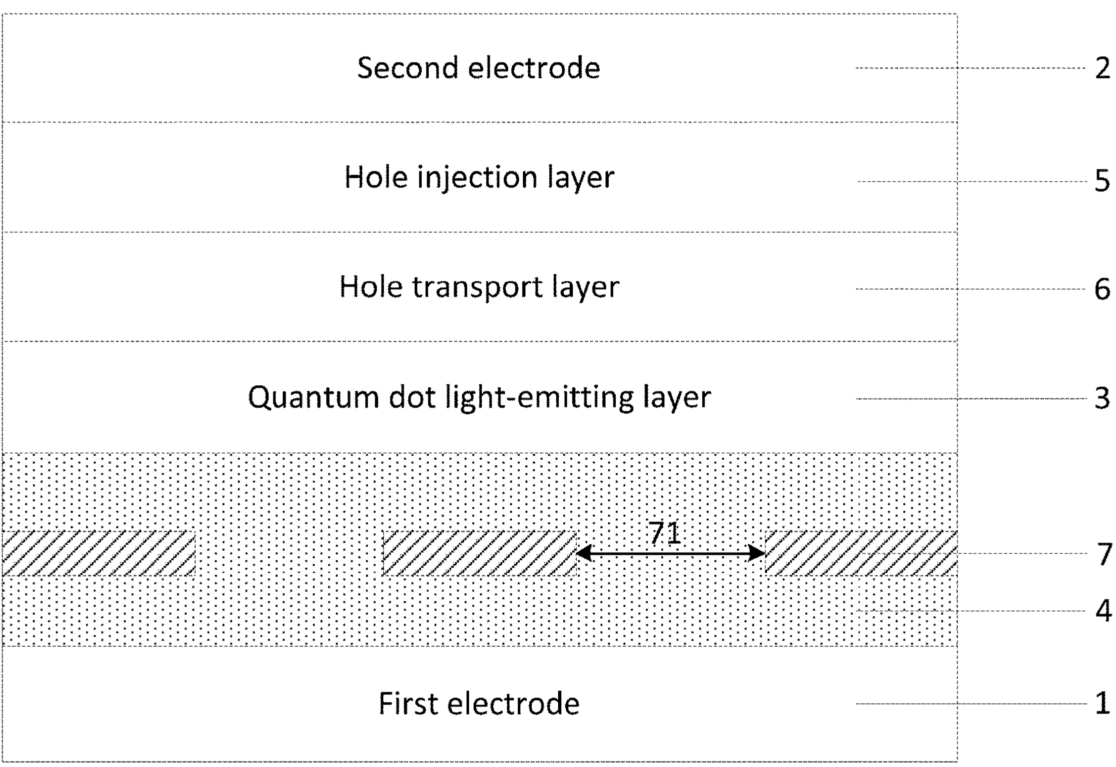
FIG. 11 is another schematic structural diagram of a top-emission quantum dot light-emitting device provided by embodiments of the disclosure.
Figure 12A:
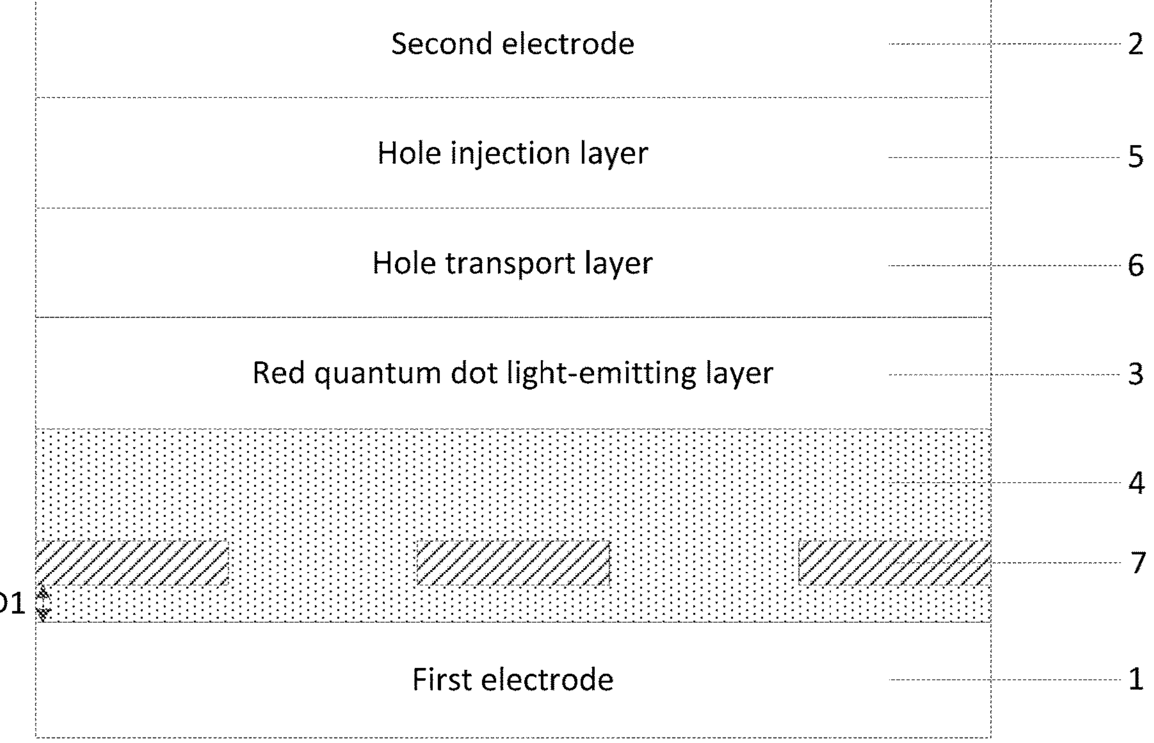
FIG. 12A is another schematic structural diagram of a red top-emission quantum dot light-emitting device provided by embodiments of the disclosure.
Figures 12B, 12C:
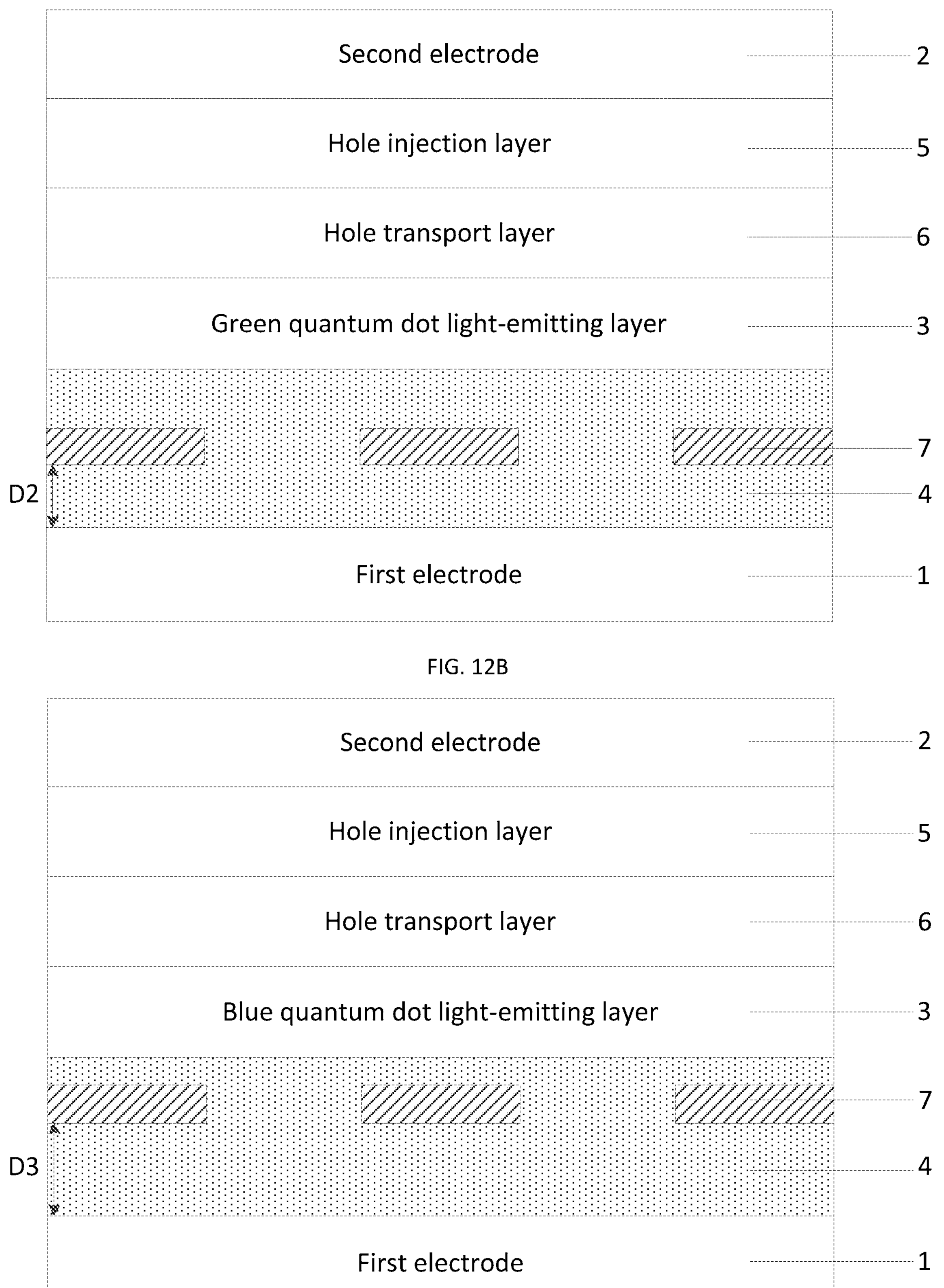
FIG. 12B is another schematic structural diagram of a green top-emission quantum dot light-emitting device provided by embodiments of the disclosure.
FIG. 12C is another schematic structural diagram of a blue top-emission quantum dot light-emitting device provided by embodiments of the disclosure.

In specific implementations, as shown in FIGS. 11, 12A-12C, 13A-13D, FIG. 11 is another cross-sectional schematic diagram of the top-emission quantum dot light-emitting device provided by the embodiments of the disclosure. FIGS. 12A-12C are cross-sectional schematic diagrams of the device in FIG. 11 with red, green, and blue quantum dot light-emitting layers, respectively. FIGS. 13A-13D are some planar schematic diagrams of the metal reflection layer 7 in FIG. 11, where the metal reflection layer 7 includes a plurality of hollow structures 71 arranged separately. Specifically, the metal reflection layer 7 with hollow structures 71 retains its reflection effect, and the hollow structures 71 can ensure the continuity of the electron transport layer 4, to improve the electrical performance. Further, in the same one light-emitting device, since the metal reflection layer 7 has the hollow structures 71, a distance between a reflective part (between the adjacent hollow structures 71) of the metal reflection layer 7 and the second electrode 2 can be taken as a kind of microcavity length. A microcavity of a region where the hollow structures 71 are located is the distance between the electron transport layer 4 and the second electrode 2. That is, microcavity lengths corresponding to two thicknesses can be formed for the region where the hollow structures 71 are located and the reflective part of the metal reflection layer 7. However, inventors of the application have found that a difference between the two microcavity lengths for the same one light-emitting device is less than 5 nm, and this difference in microcavity lengths results in a shift in the emission peak position of less than 1 nm in the photoluminescence (PL) spectrum of the light-emitting device. Therefore, although the metal reflection layer 7 changes the spectrum of emitted light, the change in color purity of the device is within an acceptable range.

It should be noted that, the structures shown in FIGS. 6 and 11 differ in the different structures of the metal reflection layer 7, and the remaining structures are the same. The structures shown in FIGS. 12A-12C and FIGS. 7A-7C differ in the different structures of the metal reflection layer 7, and the remaining structures are the same.

Figure 13A:
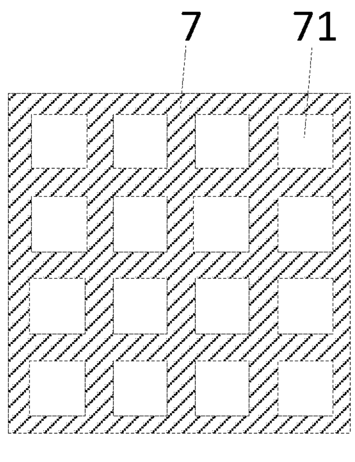
FIGS. 13A-13D are some planar schematic diagrams of a metal reflection layer in FIG. 11.
Figure 13B:
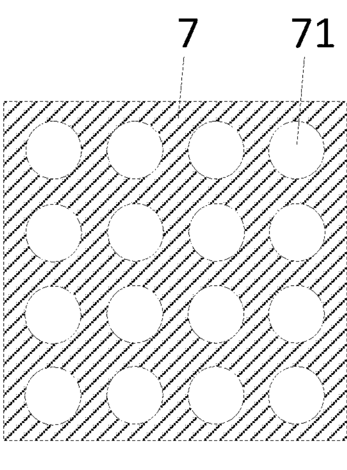
Figure 13C:
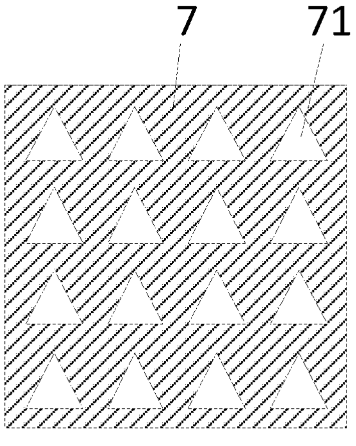

In specific implementations, in the display substrate provided by the embodiments of the disclosure, as shown in FIGS. 13A-13C, the plurality of hollow structures 71 can be arranged in an array, ensuring uniform microcavity lengths of the device and improving color purity of the device, and further unifying the manufacturing process.

In specific implementations, in the display substrate provided by the embodiments of the disclosure, as shown in FIG. 13A, a shape of the hollow structure 71 can be square; as shown in FIG. 13B, the shape of the hollow structure 71 can be circular; as shown in FIG. 13C, the shape of the hollow structure 71 can be triangular. Of course, shapes are not limited to the shapes shown here.

Figure 13D:
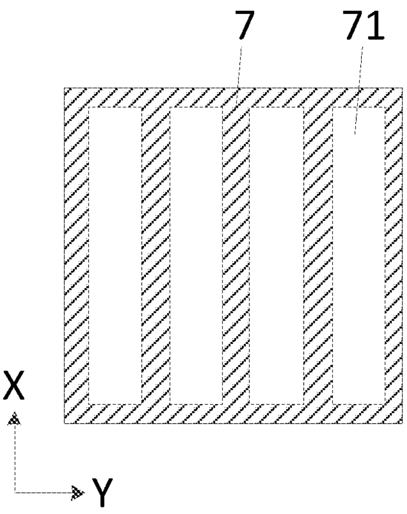

In specific implementations, the display substrate provided by the embodiments of the disclosure further includes multiple data lines extending along a first direction and arranged along a second direction. As shown in FIG. 13D, the plurality of hollow structures 71 can be multiple strip-shaped hollow structures extending along the second direction X and arranged along the first direction Y. The first direction Y and the second direction X intersect, that is, the extension direction of the data lines is perpendicular to the extension direction of the strip-shaped hollow structures. This configuration can enhance the light-emitting efficiency of the device.

In specific implementations, for top-emission quantum dot light-emitting devices with different emission wavelengths, a distance between adjacent hollow structures in each top-emission quantum dot light-emitting device is positively correlated with the emission wavelength of that device. For example, in a red top-emission quantum dot light-emitting device, the distance between adjacent hollow structures is the largest; in a green top-emission quantum dot light-emitting device, the distance between adjacent hollow structures is smaller, and in a blue top-emission quantum dot light-emitting device, the distance between adjacent hollow structures is the smallest. As such, optimal light-emitting efficiencies for top-emission quantum dot light-emitting devices with different emission wavelengths can be achieved.

In specific implementations, in the display substrate provided by the embodiments of the disclosure, as shown in FIGS. 14A-14D which are another planar schematic diagrams of the metal reflection layer 7 in FIG. 11, the metal reflection layer 7 includes multiple reflective parts 72 arranged separately and a hollow structure 71 located between adjacent reflective parts 72. In the same one light-emitting device, due to the presence of both hollow structure 71 and reflective parts 72, a distance between the reflective parts 72 and the second electrode 2 can be taken as a kind of microcavity length. A microcavity length in the region where the hollow structure 71 is located is the distance between the electron transport layer 4 and the second electrode 2. In other words, two microcavity lengths with different thicknesses can be formed in the region where the hollow structure 71 is located and a region where the reflective parts 72 are located. However, the inventors of the application have found that the difference in the above two microcavity lengths within the same light-emitting device is within 5 nm. This difference in microcavity lengths results in a shift in the emission peak position of less than 1 nm in the PL spectrum of the light-emitting device. Therefore, although the metal reflection layer 7 changes the spectrum of emitted light, the change in color purity of the device is within an acceptable range.

Figure 14A:
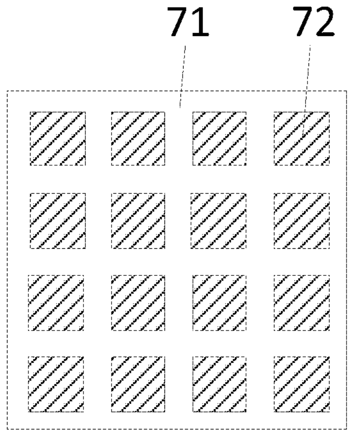
FIGS. 14A-14D are another planar schematic diagrams of a metal reflection layer in FIG. 11.
Figure 14B:
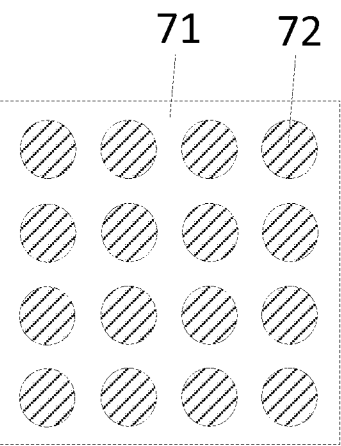
Figure 14C:
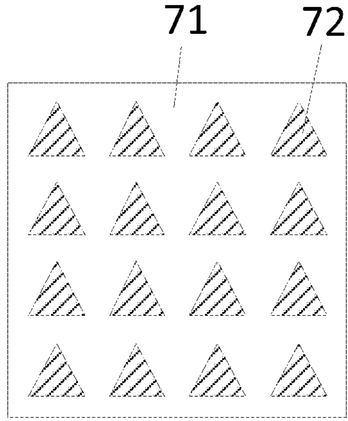

In specific implementations, in the display substrate provided by the embodiments of the disclosure, as shown in FIGS. 14A-14C, the multiple reflective parts 72 can be arranged in an array, ensuring uniform microcavity lengths of the device and improving color purity, and further unifying the manufacturing process.

In specific implementations, in the display substrate provided by the embodiments of the disclosure, as shown in FIG. 14A, a shape of the reflective part 72 can be square; as shown in FIG. 14B, the shape of the reflective part 72 can be circular; as shown in FIG. 14C, the shape of the reflective part 72 can be triangular. Of course, shapes are not limited to the shapes shown here.

Figure 14D:
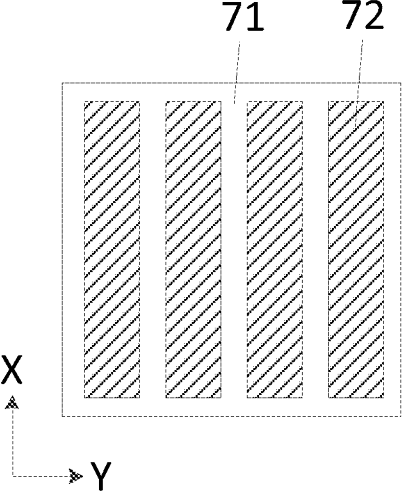

In specific implementations, the display substrate provided by the embodiments of the disclosure includes multiple data lines extending along a first direction and arranged along a second direction. As shown in FIG. 14D, the reflective parts 72 can be multiple strip-shaped reflective parts extending along the second direction X and arranged along the first direction Y. The first direction Y and the second direction X intersect, meaning that the extension direction of the data lines is perpendicular to the extension direction of the strip-shaped reflective parts. This configuration can enhance the light-emitting efficiency of the device.

In specific implementations, for top-emission quantum dot light-emitting devices with different emission wavelengths, a distance between adjacent reflective parts in each top-emission quantum dot light-emitting device is positively correlated with the emission wavelength of that device. For example, in a red top-emission quantum dot light-emitting device, the distance between adjacent reflective parts is the largest; in a green top-emission quantum dot light-emitting device, the distance between adjacent reflective parts is smaller, and in a blue top-emission quantum dot light-emitting device, the distance between adjacent reflective parts is the smallest. As such, optimal light-emitting efficiencies for top-emission quantum dot light-emitting devices with different emission wavelengths can be achieved.

It should be noted that the display substrate generally includes multiple sub-pixels, and each sub-pixel is provided with a quantum dot light-emitting device. The arrangement structure of the metal reflection layer 7 shown in FIGS. 13A-14D provided in the embodiments of the disclosure are shown within one sub-pixel.

In specific implementations, in the display substrate provided by the embodiments of the disclosure, as shown in FIG. 6, the electron transport layer 4 with the metal reflection layer 7 embedded therein is divided into upper and lower parts, which are a first electron transport layer located below the metal reflection layer 7, and a second electron transport layer located above the metal reflection layer 7. The first electron transport layer and the second electron transport layer constitute the electron transport layer 4. The combined thickness of the first electron transport layer and the second metal layer can be in the range of 50 nm to 80 nm, preferably 60 nm. As shown in FIG. 11, a thickness of the electron transport layer 4 in the region corresponding to the hollow structure 71 is in the range of 50 nm to 80 nm, preferably 60 nm. The electron transport layer 4 with the thickness of in this range can achieve optimal current efficiency.

In specific implementations, as shown in FIG. 6, FIGS. 7A-7C, FIG. 11, and FIGS. 12A-12C, in the display substrate provided by embodiments of the disclosure, it is further included a hole transport layer 6 between the quantum dot light-emitting layer 3 and the second electrode 2, and a hole injection layer 5 between the hole transport layer 6 and the second electrode 2.

In specific implementations, in the display substrate provided by the embodiments of the disclosure, as shown in FIG. 6, FIGS. 7A-7C, FIG. 11, and FIGS. 12A-12C, a thickness of the hole transport layer 6 can be in the range of 10 nm to 40 nm, preferably 25 nm to 35 nm. A material of the hole transport layer 6 can be an organic material, for example, polyethyleneimine (PVK), Poly(9,9-dioctylfluorene-alt-N-(4-sec-butylphenyl)-diphenylamine) (TFB), N,N'-Bis(3-methylphenyl)-N,N'-bis(1,1-phenyl)-4,4'-diamine (TPD), etc., or inorganic oxides such as NiOx, VOx, etc. The hole transport layer 6 can be a single-layer material or a combination of multiple materials. In the embodiments of the disclosure, two materials are combined, where the hole transport material in contact with the quantum dot light-emitting layer has a HOMO energy level between −5.5 and −6.2, close to the HOMO energy level of the quantum dot light-emitting layer, facilitating the injection of holes. The hole transport material away from the quantum dot light-emitting layer has a HOMO energy level between −5.3 and −5.0.

In specific implementations, in the display substrate provided by the embodiments of the disclosure, as shown in FIG. 6, FIGS. 7A-7C, FIG. 11, and FIGS. 12A-12C, a thickness of the hole injection layer 5 can be in the range of 3 nm to 7 nm, preferably 5 nm. The material of the hole injection layer 5 can be an organic material such as PEDOT:PSS, HAT-CN, etc., or inorganic oxides such as MoOx, NiOx, CuOx, etc.

In specific implementations, in the display substrate provided by the embodiments of the disclosure, as shown in FIG. 6, FIGS. 7A-7C, FIG. 11, and FIGS. 12A-12C, a thickness of the quantum dot light-emitting layer 3 can be in the range of 10 nm to 40 nm, preferably 20 nm to 30 nm. A material of the quantum dot light-emitting layer 3 includes but is not limited to CdS, CdSe, ZnSe, InP, PbS, $CsPbCl_3$, $CsPbBr_3$, $CsPbI_3$, CdS/ZnS, CdSe/ZnSe, CdSe/ZnS, ZnSe, InP/ZnS, PbS/ZnS, $CsPbCl_3$/ZnS, $CsPbBr_3$/ZnS, or $CsPbI_3$/ZnS, and other quantum dot materials.

In the embodiments of the disclosure, holes and electrons are injected from the second electrode and the first electrode, respectively, and after charge transfer, they reach the quantum dot light-emitting layer. The quantum dots' conduction band and valence band respectively capture electrons and holes, and luminescence occurs upon recombination.

Quantum dot light-emitting devices can have either a conventional structure or an inverted structure. The difference lies in the order of film formation. Specifically, the conventional structure includes sequentially formed first electrode, electron transport layer, quantum dot luminescent layer, hole transport layer, hole injection layer, and second electrode on the substrate. In contrast, the inverted structure includes sequentially formed second electrode, hole injection layer, hole transport layer, quantum dot luminescent layer, electron transport layer, and first electrode on the substrate.

The top-emission quantum dot light-emitting device shown in FIG. 6 and FIG. 11 can be of a conventional structure or an inverted structure. As an example of an inverted structure, as shown in FIG. 15 which shows a planar metal reflection layer 7 as an example, the top-emission quantum dot light-emitting device can further include a substrate 8 located at a side of the first electrode 1 facing away from the quantum dot light-emitting layer 3. When a conventional structure is used, as shown in FIG. 16 which shows a planar metal reflection layer 7 as an example, the top-emission quantum dot light-emitting device includes a substrate 8, and the second electrode 2, hole injection layer 5, hole transport layer 6, quantum dot luminescent layer 3, electron transport layer 4, and first electrode 1 sequentially stacked on the substrate 8. The substrate 8 can be a glass substrate or a flexible substrate, such as polyethylene glycol terephthalate (PET).

For the top-emission structure, the light emission direction of the device is away from the substrate. Specifically, in the inverted structure, as shown in FIG. 15, the first electrode 1 near the substrate 8 is an opaque electrode or includes an opaque film layer as a reflective film layer, and the second electrode 2 is a transparent electrode or a semi-transparent semi-reflective film layer, allowing light to pass through. In this case, the material of the first electrode 1 can be opaque Al, Ag, Ti, Mo (with a thickness of 60 nm to 150 nm), and ITO, FTO, or conductive polymers (with a thickness of 5 nm to 50 nm) can be deposited on Al, Ag, Ti, or Mo. In the embodiments of the disclosure, a preferred structure of the first electrode 1 is Ag (80 nm)/ITO (10 nm). A material of the second electrode 2 can include Al, Ag, Mg:Ag alloy, etc., with a thickness of 10 nm to 20 nm. Alternatively, the material of the second electrode 2 can be a transparent conductive material such as ITO, IZO, with a thickness of 40 nm to 200 nm.

In the conventional structure, as shown in FIG. 16, the second electrode 2 near the substrate 8 is an opaque electrode or includes an opaque film layer as a reflective film layer, and the first electrode 1 is a transparent electrode or a semi-transparent semi-reflective film layer, allowing light to pass through. Specifically, a material of the second electrode 2 can be opaque Al, Ag, Ti, Mo (with a thickness of 60 nm to 150 nm), and ITO, FTO, or conductive polymers (with a thickness of 5 nm to 50 nm) can be deposited on Al, Ag, Ti, or Mo. In the embodiments of the disclosure, a preferred structure of the second electrode 2 is Ag (80 nm)/ITO (10 nm). A material of the first electrode 1 can include Al, Ag, Mg: Ag alloy, etc., with a thickness of 10 nm to 20 nm. Alternatively, the material of the first electrode 1 can be a transparent conductive material such as ITO, IZO, with a thickness of 40 nm to 200 nm.

In specific implementations, to further improve the light-emitting efficiency of the quantum dot light-emitting device, the display substrate according to the embodiments of the disclosure can include a light extraction layer (capping layer) on a light emission side of the top-emission quantum dot light-emitting device. The material of the light extraction layer can be organic, and a thickness of the light extraction layer can be in the range of 40 nm to 90 nm, preferably 70 nm. In this case, the light-emitting efficiency of the device is optimal. Specifically, as shown in FIG. 15, the light extraction layer 9 is disposed at a side of the second electrode 2 facing away from the substrate 8; and as shown in FIG. 16 the light extraction layer 9 is disposed at a side of the first electrode 1 facing away from the substrate 8.

As shown in FIGS. 15 and 16, the substrate 8 may include a substrate base, a driving circuit, a passivation layer, and a planarization layer, and other structures that are stacked.

Based on the same inventive conception, the embodiments of the disclosure further provide a method for manufacturing the above-mentioned display substrate, including:

manufacturing multiple top-emission quantum dot light-emitting devices; where each top-emission quantum dot light-emitting device includes a first electrode and a second electrode opposite to each other, a quantum dot light-emitting layer between the first electrode and the second electrode, and an electron transport layer between the first electrode and the quantum dot light-emitting layer. Here, a metal reflection layer is provided inside the electron transport layer.

According to the manufacturing method of the above-mentioned display substrate provided by the embodiments of the disclosure, a metal reflection layer is provided inside the electron transport layer, and the metal reflection layer has a certain reflectance and transmittance. Therefore, the metal reflection layer can adjust the microcavity length of the device. For example, for devices of different emission colors, the position of the metal reflection layer in the electron transport layer (e.g., the distance between the metal reflection layer and the first electrode) can be set in such a way that the microcavity lengths corresponding to devices of different emission colors to be the microcavity lengths corresponding to the optimal light-emitting efficiency. Since the microcavity length can be adjusted by adjusting the position of the metal reflection layer inside the electron transport layer, the thickness of the electron transport layer can be set to a thickness range corresponding to the optimal current efficiency. This prevents the occurrence of leakage current in the device. Therefore, the embodiments of the disclosure can simultaneously achieve optimal light-emitting efficiency and optimal current efficiency for the device.

Next, taking the top-emission quantum dot light-emitting device of the inverted structure as shown in FIG. 15 as an example, the method for manufacturing the display substrate provided in the embodiments of the disclosure is described below.

(1) Depositing the first electrode 1 on the substrate 8, as shown in FIG. 17A. The substrate 8 can be a glass substrate or a flexible PET substrate, and the material and thickness of the first electrode 1 are as described in the display substrate as mentioned above.

Figure 17B:
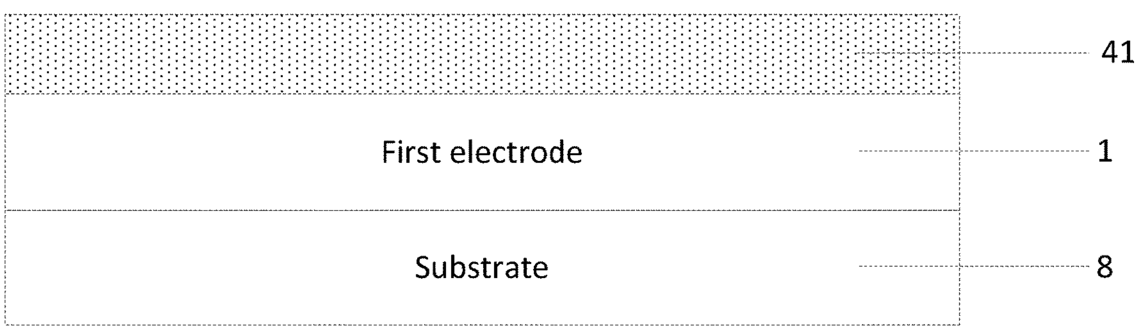

(2) Forming the first electron transport layer 41 on the first electrode 1, as shown in FIG. 17B. The material of the first electron transport layer 41 can be ZnO or ZnMgO.

Figure 17C:
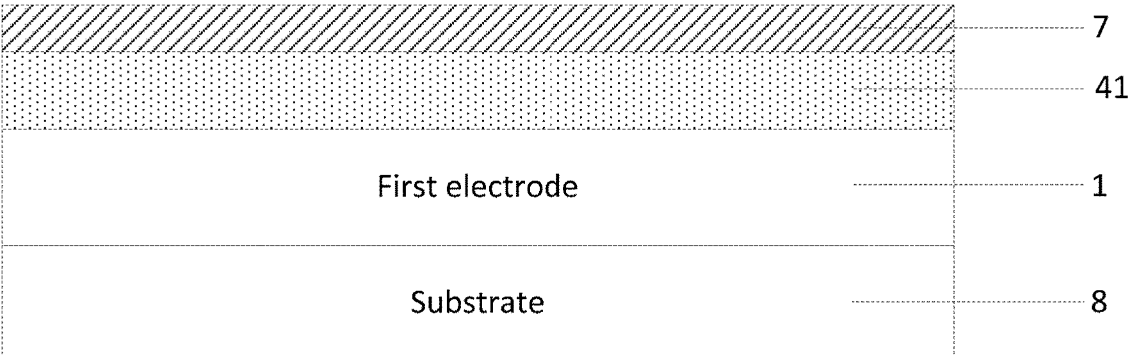

(3) Forming the metal reflection layer 7 on the first electron transport layer 41, as shown in FIG. 17C. The material of the metal reflection layer 7 can be Mg, Ag, Al, etc., with a thickness of 3 nm to 5 nm. For quantum dot light-emitting devices of different emission colors, the distance between the metal reflection layer 7 and the first electrode 1 is different, as described in the display substrate as mentioned above.

Figure 17D:
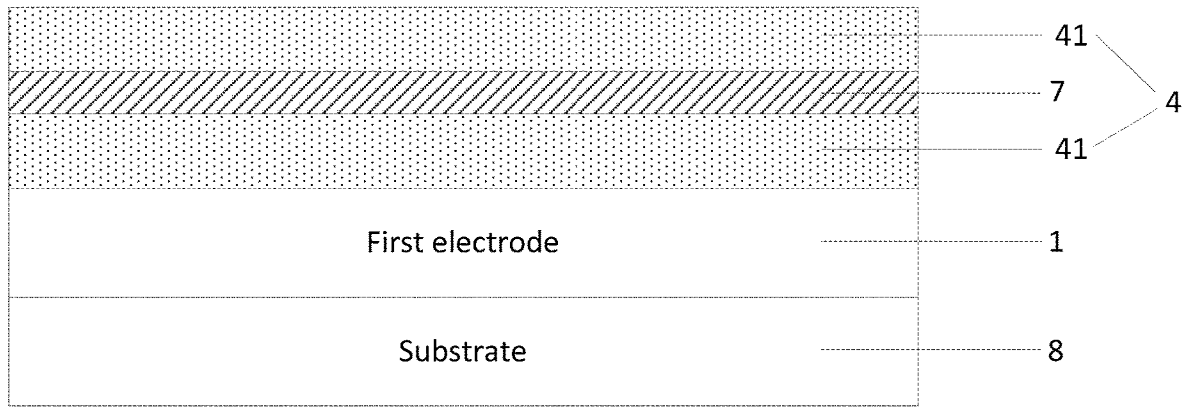

(4) Forming the second electron transport layer 42 on the metal reflection layer 7, as shown in FIG. 17D. The second electron transport layer 42 and the first electron transport layer 41 together constitute the electron transport layer 4. The material of the second electron transport layer 42 can be ZnO or ZnMgO.

(5) Depositing red, green, and blue quantum dot light-emitting layers 3 on the electron transport layer 4, as shown in FIG. 17E. The material and thickness of the quantum dot light-emitting layer 3 are as described in the display substrate as mentioned above.

Figure 17F:
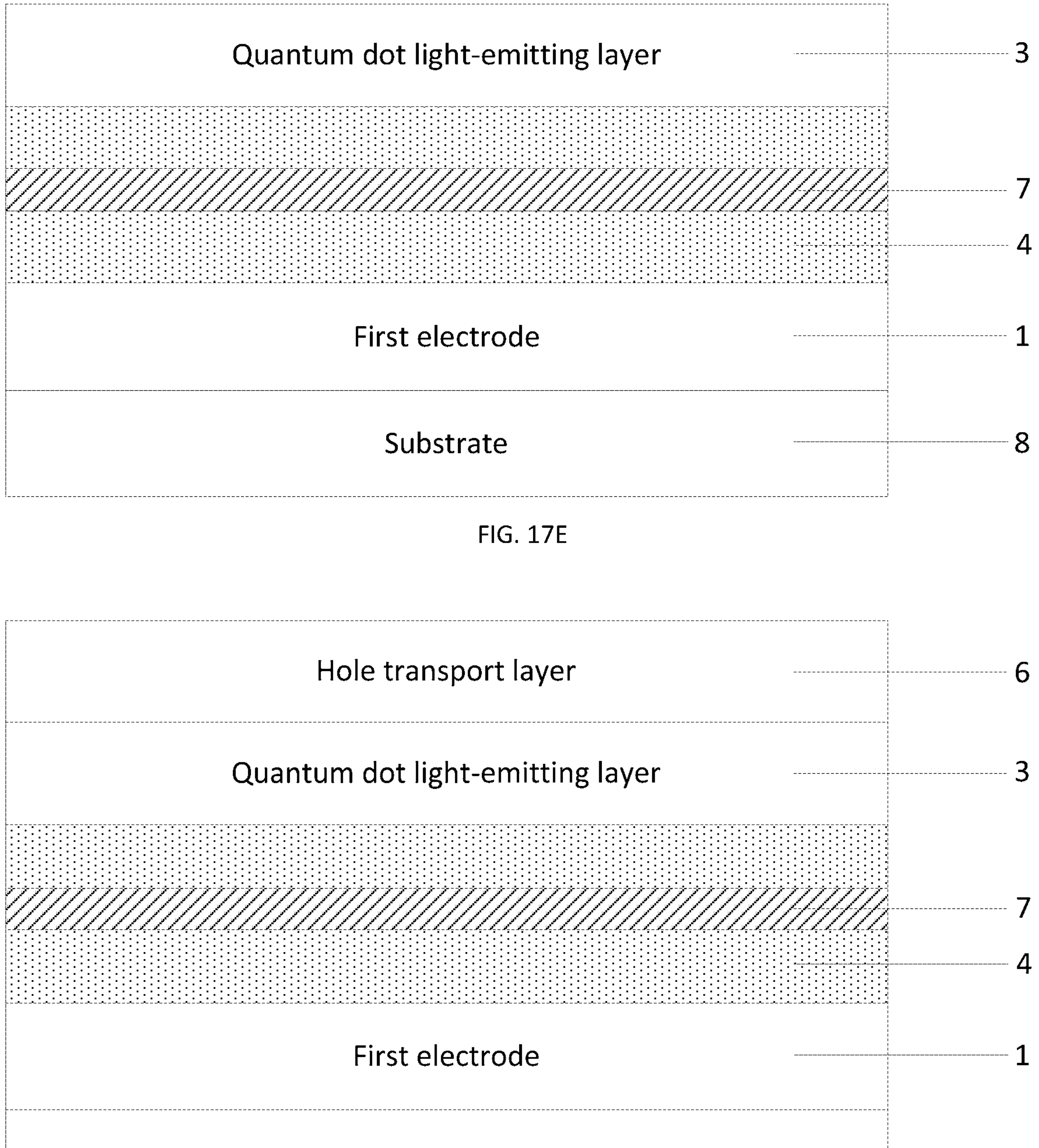

(6) Forming the hole transport layer 6 on the quantum dot light-emitting layer 3, as shown in FIG. 17F. The material and thickness of the hole transport layer 6 are as described in the display substrate as mentioned above.

Figure 17G:
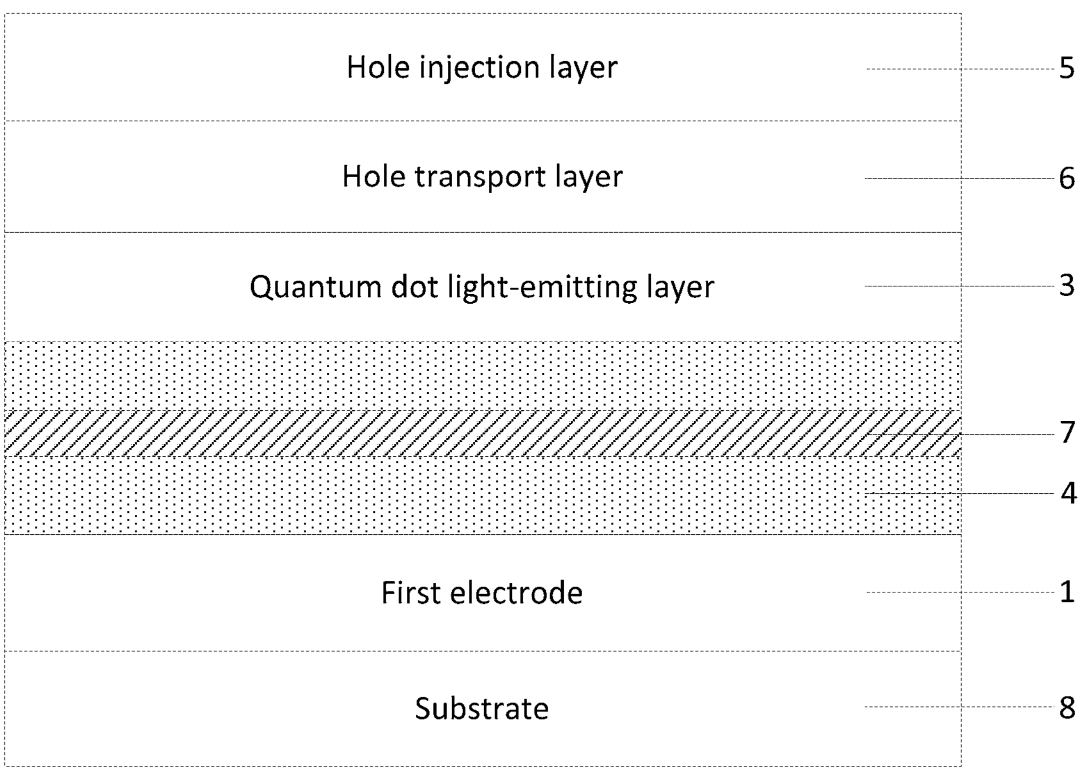

(7) Forming the hole injection layer 5 on the hole transport layer 6, as shown in FIG. 17G. The material and thickness of the hole injection layer 5 are as described in the display substrate as mentioned above.

Figure 17H:
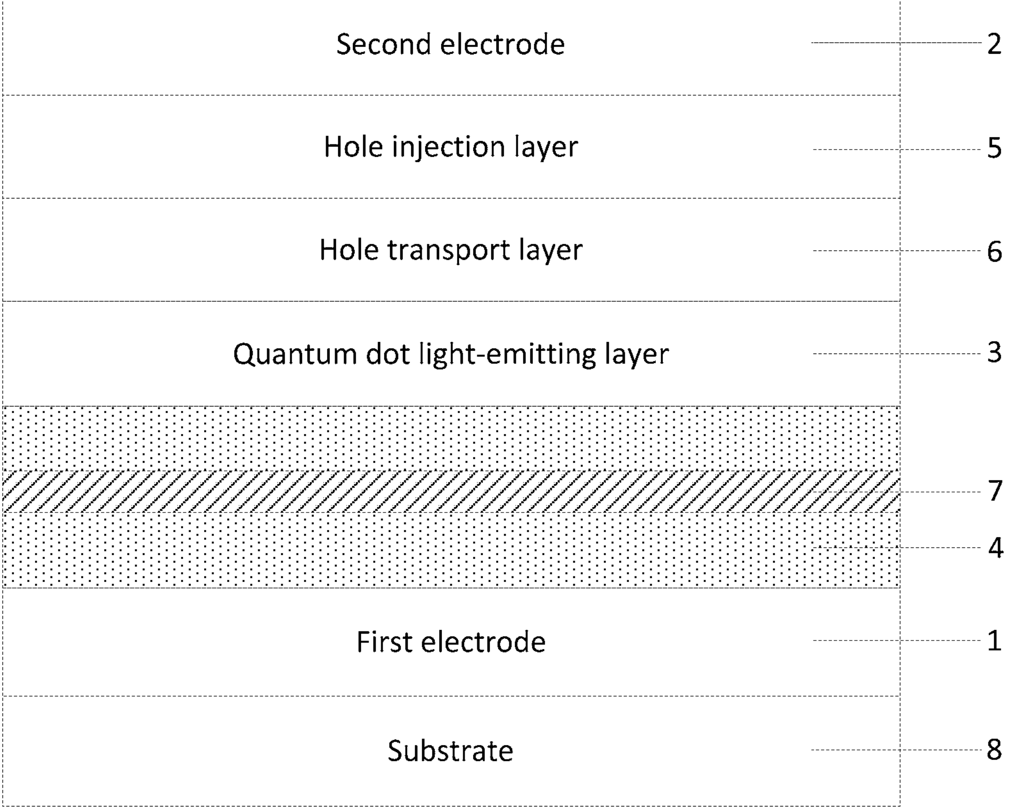

(8) Forming the second electrode 2 on the hole injection layer 5, as shown in FIG. 17H. The material and thickness of the second electrode 2 are as described in the display substrate as mentioned above.

(9) Forming the light extraction layer 9 on the second electrode 2, as shown in FIG. 15. The material and thickness of the light extraction layer 9 are as described in the display substrate as mentioned above.

Specifically, the manufacturing methods of the various film layers in the quantum dot light-emitting device mentioned above include but are not limited to spin-coating, evaporation, chemical vapor deposition, physical vapor deposition, magnetron sputtering, inkjet printing, electrohydrodynamic jet printing, and other methods known to those skilled in the art.

It should be noted that the embodiments of the disclosure mainly provides a detailed description of the manufacturing method of quantum dot light-emitting devices with an inverted structure as an example. The manufacturing method of quantum dot light-emitting devices with a conventional structure only differs in the film formation sequence, which is not described in detail here.

Based on the same inventive conception, embodiments of the disclosure further provide a display apparatus, including the above-mentioned display substrate provided in the embodiments of the disclosure. The display apparatus can be any product or component with display functionality, such as a mobile phone, a tablet computer, a television, a monitor, a laptop computer, a digital photo frame, a navigator, and the like. Other essential components of the display apparatus known to those skilled in the art should be understood and are not repeated here, and they should not be considered as limitations to the invention. As the principles of solving the problems for the display apparatus are similar to those of the previously described display substrate, the implementation of the display apparatus can refer to the implementation of the previously described display substrate, and redundant details are not repeated.

In specific implementations, the display apparatus provided by the embodiments of the disclosure may further include other film layers known to those skilled in the art, and they are not detailed here.

In the display substrate, the method for manufacturing the display substrate, and the display apparatus provided in the embodiments of the disclosure, the metal reflection layer is provided inside the electron transport layer to adjust the microcavity length of the device. For example, while ensuring the electrical balance of the device, a microcavity length (not conductive to light extraction) corresponding to a larger current efficiency (thicker electron transport layer) can be adjusted to a more suitable microcavity length (reducing the microcavity length is conducive to light extraction). By adjusting the light emission of the device through the microcavity between the metal reflection layer and the second electrode, a thickness of the electron transport layer between the metal reflection layer and the quantum dot light-emitting layer can be reduced, thereby achieving optimal light-emitting efficiency. In this case, there is still an electron transport layer between the metal reflection layer and the first electrode, and this part of the electron transport layer can be used to adjust the electrical balance of the device, so that the thickness of the electron transport layer in the device does not become too low, and the electrical balance of the device can be achieved. Therefore, according to the embodiments of the disclosure, optimal light-emitting efficiency and optimal current efficiency of the device can be achieved simultaneously.

Although the preferred embodiments of the disclosure have been described, those skilled in the art will be able to make additional changes and modifications to these embodiments once the basic inventive concepts are apparent. Therefore, it is intended that the appended claims be construed to include the preferred embodiments and all changes and modifications that fall within the scope of this disclosure.

Obviously, those skilled in the art can make various changes and modifications to the disclosed embodiments without departing from the spirit and scope of the disclosed embodiments. In this way, if these modifications and variations of the embodiments of the disclosure fall within the scope of the claims of the disclosure and equivalent technologies, the disclosure is also intended to include these modifications and variations.

What is claimed is:

1. A display substrate comprising multiple top-emission quantum dot light-emitting devices, and each of the multiple top-emission quantum dot light-emitting devices comprising:

a first electrode and a second electrode arranged opposite to each other;

a quantum dot light-emitting layer between the first electrode and the second electrode; and an electron transport layer between the first electrode and the quantum dot light-emitting layer;

wherein, a metal reflection layer is provided inside the electron transport layer;

wherein the multiple top-emission quantum dot light-emitting devices comprise multiple top-emission quantum dot light-emitting devices with different emission wavelengths; and a distance between the metal reflection layer and the first electrode in each of the multiple top-emission quantum dot light-emitting devices is inversely correlated with an emission wavelength of the each of the multiple top-emission quantum dot light-emitting devices;

wherein a proportion of oxygen vacancies on a surface of the electron transport layer in contact with the first electrode is less than a proportion of oxygen vacancies on a surface of the electron transport layer in contact with the metal reflection layer; and wherein a ratio of an area of the metal reflection layer to an area of the electron transport layer in each of the multiple top-emission quantum dot light-emitting devices ranges from 50% to 100%.

2. The display substrate according to claim 1, wherein an included angle between a plane where the metal reflection layer is located and a plane where the electron transport layer is located is less than 1‰ degree.

3. The display substrate according to claim 1, wherein the multiple top-emission quantum dot light-emitting devices with different emission wavelengths comprise red top-emission quantum dot light-emitting devices, green top-emission quantum dot light-emitting devices, and blue top-emission quantum dot light-emitting devices; and a distance between a metal reflection layer and a first electrode in the red top-emission quantum dot light-emitting devices is a first distance, a distance between a metal reflection layer and a first electrode in the green top-emission quantum dot light-emitting devices is a second distance, and a distance between a metal reflection layer and a first electrode in the blue top-emission quantum dot light-emitting devices is a third distance;

wherein the first distance ranges from 0 to 20 nm, the second distance ranges from 20 nm to 40 nm, and the third distance ranges from 40 nm to 60 nm.

4. The display substrate according to claim 1, wherein the metal reflection layer has a planar structure; and wherein the area of the metal reflection layer is smaller than the area of the electron transport layer; and the metal reflection layer is located in a central region of the electron transport layer.

5. The display substrate according to claim 1, wherein the metal reflection layer comprises multiple hollow structures arranged separately; and wherein the multiple hollow structures are arranged in an array.

6. The display substrate according to claim 5, further comprising multiple data lines extending along a first direction and arranged along a second direction;

wherein the multiple hollow structures are strip-shaped hollow structures extending along the second direction and arranged along the first direction; and the first direction and the second direction intersect.

7. The display substrate according to claim 5, wherein a distance between adjacent hollow structures in each of the multiple top-emission quantum dot light-emitting devices is positively correlated with an emission wavelength of the each of the multiple top-emission quantum dot light-emitting devices.

8. The display substrate according to claim 1, wherein the metal reflection layer comprises multiple reflective parts arranged separately and a hollow structure between adjacent reflective parts;

wherein the multiple reflective parts are arranged in an array.

9. The display substrate according to claim 8, further comprising multiple data lines extending along a first direction and arranged along a second direction;

wherein the multiple reflective parts are strip-shaped reflective parts extending along the second direction and arranged along the first direction; and the first direction and the second direction intersect.

10. The display substrate according to claim 8, wherein a distance between adjacent reflective parts in each of the multiple top-emission quantum dot light-emitting devices is positively correlated with an emission wavelength of the each of the multiple top-emission quantum dot light-emitting devices.

11. The display substrate according to claim 1, wherein a reflectance of the metal reflection layer in a visible light range ranges from 30% to 60%; and wherein a work function of the metal reflection layer ranges from 2.2 eV to 4.2 eV, and a thickness of the metal reflection layer ranges from 3 nm to 5 nm.

12. The display substrate according to claim 1, wherein a material of the metal reflection layer comprises Mg, Ag, or Al; and wherein a material of the electron transport layer comprises metal oxide nanoparticles, and a surface of the metal reflection layer facing away from the first electrode is uneven.

13. The display substrate according to claim 1, wherein a thickness of the electron transport layer ranges from 50 nm to 80 nm.

14. The display substrate according to claim 1, further comprising:

a hole transport layer between the quantum dot light-emitting layer and the second electrode; and a hole injection layer between the hole transport layer and the second electrode;

wherein a thickness of the hole transport layer ranges from 10 nm to 40 nm, a thickness of the hole injection layer ranges from 3 nm to 7 nm, and a thickness of the quantum dot light-emitting layer ranges from 10 nm to 40 nm.

15. A display apparatus comprising the display substrate according to claim 1.

* * * * *